(12) United States Patent
Tanioka et al.

(10) Patent No.: US 7,218,131 B2
(45) Date of Patent: May 15, 2007

(54) INSPECTION PROBE, METHOD FOR PREPARING THE SAME, AND METHOD FOR INSPECTING ELEMENTS

(75) Inventors: Michinobu Tanioka, Tokyo (JP); Yoshihiko Nemoto, Tokyo (JP); Katsuyuki Ito, Osaka (JP)

(73) Assignees: Renesas Technology Corp., Tokyo (JP); NEC Corporation, Tokyo (JP)

( * ) Notice: Subject to any disclaimer, the term of this patent is extended or adjusted under 35 U.S.C. 154(b) by 0 days.

(21) Appl. No.: 11/074,243

(22) Filed: Mar. 7, 2005

(65) Prior Publication Data

US 2006/0082380 A1    Apr. 20, 2006

(30) Foreign Application Priority Data

Mar. 19, 2004    (JP)    ................. 2004-81275

(51) Int. Cl.
*G01R 31/02*    (2006.01)
(52) U.S. Cl. ...................... 324/762; 324/754
(58) Field of Classification Search ........ 324/754–762, 324/765; 439/482
See application file for complete search history.

(56) References Cited

U.S. PATENT DOCUMENTS

| | | | | |
|---|---|---|---|---|
| 4,636,722 A | * | 1/1987 | Ardezzone | 324/754 |
| 5,773,987 A | * | 6/1998 | Montoya | 324/757 |
| 6,633,176 B2 | * | 10/2003 | Takemoto et al. | 324/754 |
| 2003/0214038 A1 | * | 11/2003 | Nemoto | 257/738 |

FOREIGN PATENT DOCUMENTS

| | | |
|---|---|---|
| JP | 5-198636 | 8/1993 |
| JP | 6-140482 | 5/1994 |
| JP | 6-324081 | 11/1994 |
| JP | 6-331655 | 12/1994 |
| JP | 6-334005 | 12/1994 |
| JP | 6-334006 | 12/1994 |
| JP | 10-38918 | 2/1998 |
| JP | 2002-257859 | 9/2002 |
| JP | 2002-286755 | 10/2002 |
| JP | 2002-286758 | 10/2002 |
| JP | 2003-121466 | 4/2003 |
| JP | 2003-185674 | 7/2003 |
| JP | 2003-207521 | 7/2003 |
| JP | 2003-322664 | 11/2003 |

* cited by examiner

*Primary Examiner*—Vinh P. Nguyen
(74) *Attorney, Agent, or Firm*—Scully, Scott, Murphy & Presser, P.C.

(57) ABSTRACT

An inspection probe comprises resilient probe pins having electric contacts disposed in positions corresponding to electrodes of an external terminal of a semiconductor device, a base substrate including pitch-expansion wiring layers of the probe pins, and a backup substrate, the base substrate, and a flexible substrate, wherein at least one precious metal layer is disposed at the tip of the probe pins on the side having the electric contact for contacting the electrodes of the semiconductor device to be inspected, at least one metal layer is disposed on the probe pins and the pitch-expansion wiring layers, the precious metal layer and the metal layer are composed of the same material or composed of different materials, and a roughness pattern comprising fine marks is provided on the surfaces of the probe pins on the side having the electric contacts for contacting the electrodes of the semiconductor device to be inspected.

10 Claims, 30 Drawing Sheets

DIMENSION OF ROUGHNESS PATTERN
Max:0.67 μm, Ave:0.28 μm, Min:0.10 μm, N=84

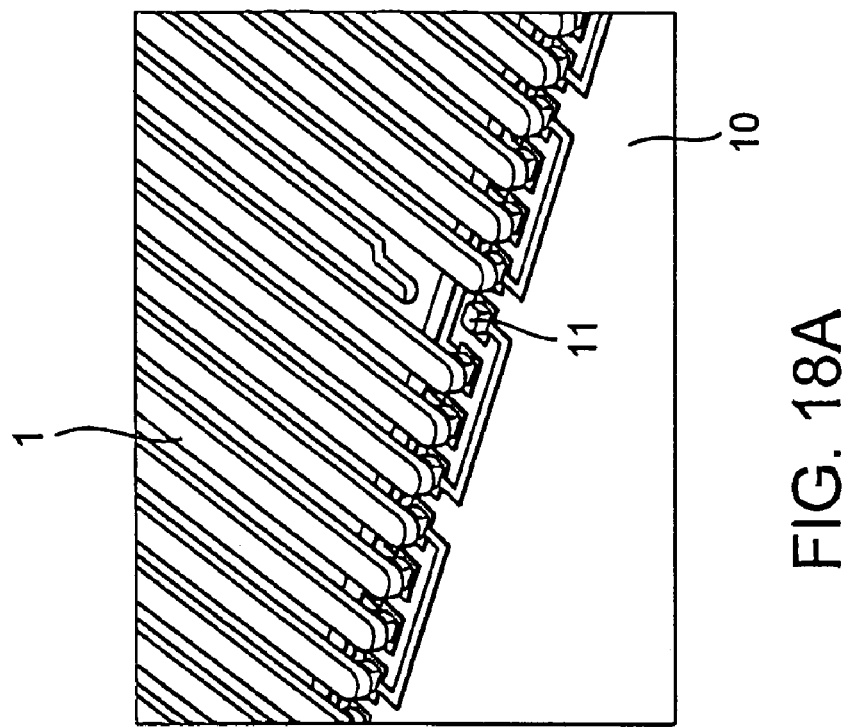
FIG. 18A
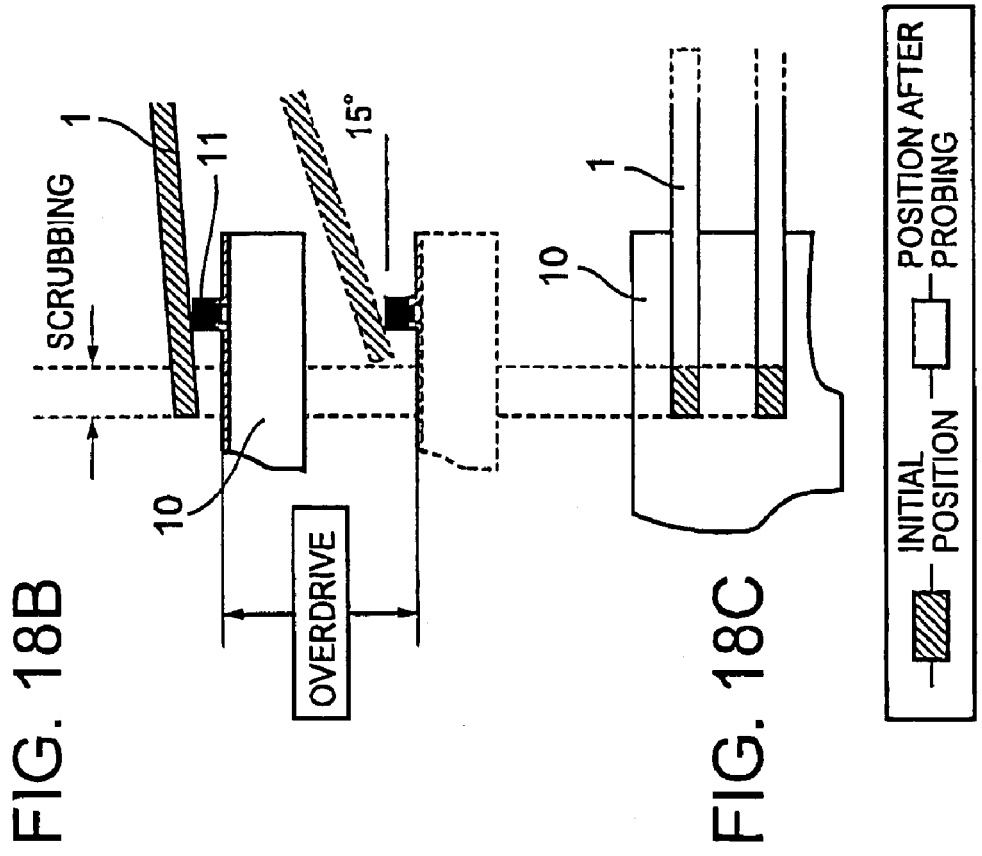
FIG. 18B
FIG. 18C

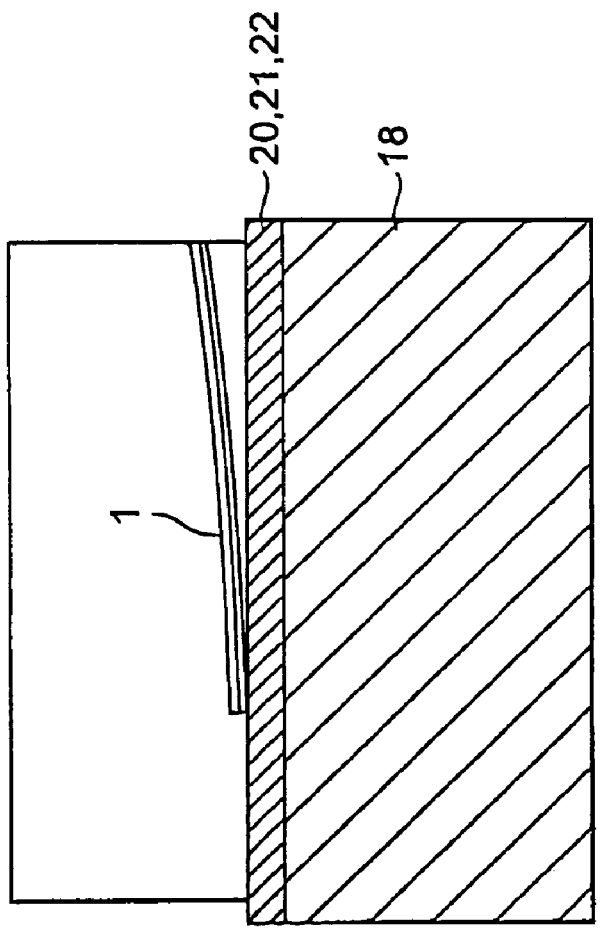
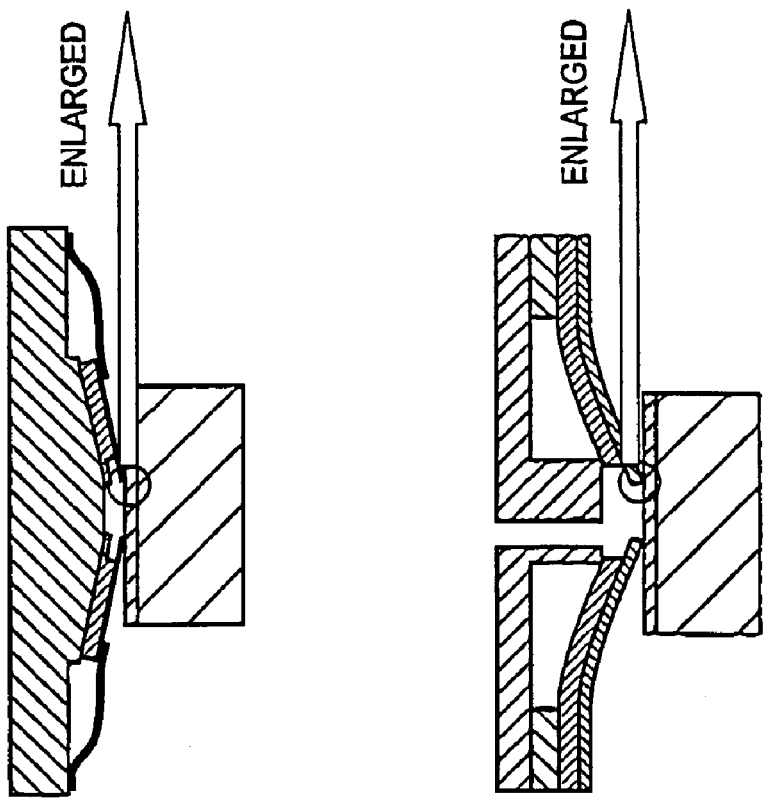
FIG. 21A
FIG. 21B

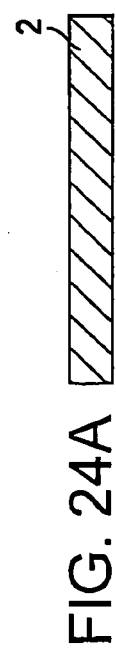

← → SHOWS THE DIRECTION OF VIBRATION

INSPECTION PROBE, METHOD FOR PREPARING THE SAME, AND METHOD FOR INSPECTING ELEMENTS

BACKGROUND OF THE INVENTION

1. Field of the Invention

The present invention relates to an inspection probe including probe pins having electric contacts that come into contact with electrodes (pad or bump) of a large scale integration (LSI) chip or a bear LSI chip (bear chip) (i.e., a semiconductor device). More specifically, the present invention relates to an inspection probe including probe pins having electric contacts suitable for inspecting an LSI chip or a bear chip including electrodes having oxidation films and having a small electrode pitch. Moreover, the present invention relates to a method for preparing the inspection probe and a method for inspecting elements.

2. Description of the Related Art

A known inspection probe conducts an inspection of a semiconductor device by bringing probes provided on an inspection substrate into contact with the external terminal electrodes of the semiconductor device to be inspected and electrically connecting the semiconductor device and the inspection substrate. The probe pins may be metal leads attached to a flexible substrate, metal leads attached to a rigid base substrate, pins prepared by plating silicon whiskers or metal pins. Three different types of inspection probes have been proposed: a membrane sheet including metal leads (tape automated bonding (TAB)), metal leads attached to a rigid base substrate, and silicon whiskers. These different structures will be described below.

(1) A Probe Using a Membrane Sheet Including Metal Leads (TAB)

This type of probe includes those disclosed in JP-A-6 334006, JP-A-6 334005, JP-A-6 331655, and JP-A-6 324081. The probes described in these documents are structured so that metal leads provided on a flexible substrate oppose external electrodes of the semiconductor device to be inspected. FIGS. 1A and 1B illustrate the probe card disclosed in JP-A-6 334006 as a typical example of this type of probe. A predetermined inspection circuit pattern and probe pins 1 are provided on one side of a flexible film 30 of the probe card illustrated in FIG. 1. The probe pins 1 come into contact with external electrodes of a semiconductor device 10.

The probe pins 1 cannot obtain the desired amount of contact when using only a flexible substrate 7 because the flexible substrate 7 is thin. Therefore, a clamper 32 and a support 36 are provided to support both sides of the flexible substrate 7. In this way, the desired amount of contact by the probe pins 1 can be obtained. The clamper 32, the flexible substrate 7, the film 30, an insulating sheet 31, a print substrate 34, and a reinforcement plate 35 are fixed to the support 36 with a plurality of bolts 33.

(2) A Probe Using Metal Leads Attached to a Rigid Base Substrate

This type of probe includes those disclosed in JP-A-2002 286755, JP-A-2002 286758, and JP-A-2003 185674. The probes described in these documents are structured so that metal leads provided on a rigid base substrate oppose external electrode of the semiconductor device to be inspected. The structural views of FIGS. 2A, 2B and 3 illustrate the probe units and the method for preparing the probe units disclosed in JP-A-2002 286758 and JP-A-2003 185674 as a typical example of this type of probe. FIGS. 2A and 2B illustrate the entire structure of the probe unit. The probe unit comprises a rigid base substrate 2 that may be composed of glass, synthetic resin, ceramic, silicon laminated with an insulating material, or metal (according to the column 4, lines 40 to 44 of JP-A-2003 121466). On one side of the rigid base substrate 2, leads 3 and arc-shaped probe pins 1 are provided, or instead, the leads 3, the arc-shaped probe pins 1, and protrusions 39 are provided. The probe pins 1 come into contact with the external electrodes of the semiconductor device. A metal piece 37 is passed through a communication hole 38 formed on the rigid base substrate 2.

The probe pins 1 are resilient and are capable of contacting the electrodes of the semiconductor device with a predetermined amount of penetration and load within an elastic deformation region.

FIG. 3 illustrates the shapes of the tips of the probe pins that come into contact with the electrodes of the semiconductor device. The tips of the probe pins comprise steepled or knife-edge protrusions 41, 43, and 45 provided at the tips of the probe pins and supports 40, 42, and 44.

(3) A Probe Using Silicon Whiskers

This type of probe includes those disclosed in JP-A-10 038918, JP-A-2002 257859, and JP-A-5 198636. FIG. 9 is a structural view illustrating a probe pin and a contactor including the probe pin as a typical example of this type of probe disclosed in JP-A-10 038918. According to this document, probe pins 1 are prepared by growing silicon needle crystals 53 and covering the needle crystals with a nickel base film 54 and then with a gold film. On the gold film at the tips of the needle crystals, a palladium film 56 is provided. The silicon needle crystals 53 are grown by a vapor-liquid-solid (VLS) crystal growth method by placing a gold seeds for growing the crystals on a silicon substrate 52. The probe pins 1 according to this document have a conductive film provided on the surfaces and are used for semiconductor measurements. Only the tips of the probe pins 1 are covered with a conductive material.

(4) A Probe Using Metal Pins

The probe device disclosed in JP-A-6 140482 is illustrated in FIGS. 10A and 10B. The probe device comprises extremely fine wire probe needles 57 prepared by processing metal pins, such as tungsten pins, and crystal probe needles 60. The probe device has a short electrode pitch but can be provided at low cost. For example, to prepare this probe device, the tungsten wire probe needles 57 and the crystal probe needles 60 are provide on a printed circuit board 34 wherein the tungsten wire probe needles 57 are provided in areas where the electrode pitch is wide (300 to 400 μm) and the crystal probe needles 60 are provided in areas where the electrode pitch is narrow (45 to 65 μm). The crystal probe needles 60 are prepared by forming electrode patterns by etching the tip of a crystal plate 58 and plating the surface with gold. Since the crystal probe needles 60 are used, the electrode pitch may be reduced to a very fine pitch level of 40 μm. By using different probes in areas having different electrode pitches, the production cost of the probe device is reduced compared to the production cost for a probe device that includes only crystal probes. The wire probe needles 57 are supported on the printed circuit board 34 so that they protrude into a window 59 formed on the printed circuit board 34. The crystal probe needles 60 are disposed on a flexible substrate 7 so that they protrude into the window 59 formed on the printed circuit board 34. The flexible substrate 7 is supported on the printed circuit board 34 and is connected with a contact pin 61 on the printed circuit board 34. The printed circuit board 34 includes an X-axis bolt 33a, a Z-axis bolt 33b, a θ-axis bolt 33c, and a Y-axis adjuster 62.

The probe unit disclosed in JP-A-2003 207521 comprises probe pins and a probe support including an inorganic insulating layer, and a base metal layer.

The probe pins of a probe unit disclosed in JP-A-2003 322664 are provided as part of lead patterns formed on the surface of the substrate by lithography.

Since the probe card disclosed in JP-A-6 334006 includes a flexible film as a substrate, the following problems exist: 1) it is difficult to control the positional accuracy in the pitch direction of the metal leads at a predetermined value (±1.0 μm or less) when the pitch is 40 μm or less, due to the thermal history of the film substrate preparation process; 2) the metal lead and the electrode of the semiconductor device are misaligned when a high-temperature inspection of 80 to 100° C. is carried out on the wafer, because the thermal expansion coefficient of the film material (several tens of ppm) is greater than the thermal expansion coefficient of the silicon of the semiconductor (2 to 3 ppm); and 3) it is difficult to obtain good contact between probe pins and the semiconductor electrode when the probe pins are composed of a single metal material having elasticity and the semiconductor electrode is composed of a material having an oxidation film of aluminum or copper.

The probe unit and the method for preparing the probe unit disclosed in JP-A-2002 286758 use a glass plate, a synthetic resin plate, a ceramic plate, a silicon plate covered with an insulating material, or a metal plate for a substrate. Since the thermal expansion coefficient except for a synthetic resin is relatively similar to silicon, the reduction of the accuracy due to the thermal history during manufacturing and the displacement during a high-temperature test are extremely small and do not cause any problems. Thus, this probe unit solves the first and second problems of the probe card according to JP-A-6 334006.

Even if the semiconductor electrode comprises an oxidation film, the oxidation film can be penetrated by the protrusions formed on the top of the arcs according to JP-A-2002 286758 and the steepled protrusions or the knife-edge protrusions according to JP-A-2003 185674.

However, to penetrate the oxidation film, the steepled protrusions or the knife-edge protrusions must have a radius of curvature smaller than a predetermined value. Especially, when the pitch of the semiconductor electrodes is reduced to 40 μm or less, the size of the probe pins has to be reduced. For this reason, the amount of overdrive (penetration amount of the probe into the electrode) that does not cause the probe pins to elastically deform is reduced. Thus, the amount of force that can be applied to the contact areas becomes significantly small. Accordingly, the following problems exist: 1) the production cost of the probe pins increases significantly compared to other known probe pins to satisfy the requirements for the radius of curvature; and 2) elastic deformation occurs due to concentration of stress during contact at the base of the area where a steepled protrusion or a knife-edge protrusion is formed on the tip of the knife-edge area of the probe pin because the thickness of this area is thinner than the other areas. These problems will be described in detail below.

FIGS. 4A and 4B are views showing the tips of probe pins having a pitch of 20 μm. A pitch expansion wiring layer 3 of probe pins 1 is provided on a base substrate 2. A flexible substrate 7 is connected to the base substrate 2. A knife-edge portion 46 is formed on the tip of a thin portion 47 of each of the probe pins 1.

FIGS. 5A and 5B illustrate the measurement results of the contact characteristics of the probe pins 1. All probe pins become conductive when an overdrive of 50 μm or more is applied. However, among these probe pins, there are areas that are highly resistive. FIG. 6 illustrates a tip 48 of the probe pin 1 causing a scrub mark (a low-resistance area 50) on an electrode of a semiconductor device 10 and a tip 49 of the probe pin 1 causing a scrub mark (a high-resistance area 51) on the electrode. Where a high-resistance area occurs, the tip 49 of the probe pin 1 becomes round. Consequently, the probe pin 1 slips on the surface of the electrode, the oxidation film interposed between the surface of the electrode and the probe pin 1 at the contact area is not penetrated by the probe pin 1. To solve this problem, the knife-edge protrusion must be adjusted so that the radius of the tip is 0.36 μm or less, which is the same level as the low-resistance area 50. FIG. 7 is a view showing the vicinity of the tip of the probe pin 1 and the dimensions of the probe pin 1. FIG. 8 is a view showing the contact condition of the probe pin 1. As shown in FIG. 7, a thin area exists between the knife-edge area and the base material of the probe pin 1 and deformation occurs from the base of this thin area. As a result of several contacts made between the electrode and the probe pin, the thin area becomes elastically deformed and causes the probe pin 1 to malfunction. The length of the thin area can be shortened by improving the processing carried out before the knife-edge area is formed. However, it is impossible to reduce the length of the thin area to zero. Moreover, the production cost will be significantly increased if the length of the thin area is minimized.

The above-described two problems can be easily and clearly understood through the above-described examples according to JP-A-2002 286758 and JP-A-2003 185674.

JP-A-10 038918 discloses a structure in which probe pins prepared by plating needle crystals contact external electrodes of a semiconductor device. Because of this structure, when pins having a diameter of about 10 μm, which is suitable for an electrode pitch of 20 μm (the pitch should be 40 μm or less), it becomes extremely difficult to dispose a gold bump onto a silicon mesa before growing the pins and damage occurs because of stress caused when a metal film is applied and when the tips of the pins are trimmed after the pins are formed. Therefore, due to these reasons, the following problems occur: 1) it is difficult to maintain the positional accuracy corresponding to the electrode pitch of the semiconductor device; 2) the pins break when an overdrive is applied because the pins are extremely fine and have an exceptionally small diameter and thus lack strength; and 3) the production cost is high because a metal film is applied over the entire silicon pin and another metal film is applied to the tip of the pin to provide conductivity.

According to the structure disclosed in JP-A-6 140482, either tungsten wire probe pins or crystal probes are used to contact external electrodes of a semiconductor device in accordance with the magnitude of the electrode pitch. Because of this structure, the diameter of the wire probe pins has to be 20 μm or less for areas having a small electrode pitch of 40 μm or less. Therefore, the following problems occur: 1) it is extremely difficult to manufacture the probe pins, and even if the probe pins are manufactured successfully, it is extremely difficult to align them accurately and the probe pins lack durability; 2) it is difficult to maintain positional accuracy with respect to the electrode pitch of the semiconductor device of the crystal probes because of the stress generated when a metal film is applied to the crystal probes, which is a problem similar to the silicon pins according to JP-A-10 038918; 3) the pins break when an overdrive is applied because the pins are extremely fine with an exceptionally small diameter and lack strength; 4) the production cost is high when only crystal probes are used;

and 5) the pins are not durable enough to be used at a practical level even when the overdrive applied does not cause the pins to break, which is a problem similar to that in JP-A-10 038918.

SUMMARY OF THE INVENTION

Accordingly, it is an object of the present invention to provide an inspection probe including probe pins having electric contacts suitable for practical use in inspecting a semiconductor comprising an external terminal including electrodes having a narrow pitch and oxidation films, a method for preparing the inspection probe, and a method for inspection.

According to the present invention, the following means are provided.

An inspection probe comprises resilient probe pins having electric contacts disposed in positions corresponding to electrodes of an external terminal of a semiconductor device at an angle between zero to ninety degrees to the surface of the electrodes on the semiconductor device, the probe pins being disposed as independent structures; a base substrate including pitch-expansion wiring layers of the probe pins; and a backup substrate for supporting the probe pins, the base substrate, and a flexible substrate, the flexible substrate being interposed between the base substrate and an inspection substrate to be attached to a semiconductor inspection device together with the pitch-expansion wiring layers; wherein at least one precious metal layer is disposed in a predetermined area at the tip of the probe pins on the side having the electric contact for contacting the electrodes of the semiconductor device to be inspected, wherein at least one metal layer is disposed on the probe pins and the pitch-expansion wiring layers, wherein the precious metal layer and the metal layer are composed of the same material or composed of different materials, wherein a roughness pattern comprising fine marks is provided on the surfaces of the probe pins on the side having the electric contacts for contacting the electrodes of the semiconductor device to be inspected, and wherein the probe pins comprise a resilient base material.

A method for inspecting electrodes of a semiconductor device with an inspection probe comprises probe pins having a roughness pattern, the method comprising the steps of: bringing the probe pins into contact with the electrodes of the semiconductor device; applying a predetermined overdrive to the probe pins while the probe pins are in contact with the electrodes of the semiconductor; removing oxidation films on the electrodes of the semiconductor by applying vibrational energy to one of the probe pins and the semiconductor device; and electrically contacting the probe pins to the electrodes of the semiconductor.

BRIEF DESCRIPTION OF THE DRAWINGS

FIG. 1A and FIG. 1B illustrate a first example of the prior art wherein FIG. 1A is a cross-sectional view and FIG. 1B is a perspective view;

FIGS. 4A and 4B are specific examples of the second example of the prior art wherein FIG. 4A is a perspective view and FIG. 4B is an expanded view of the circled area in FIG. 4A.

FIGS. 10A and 10B illustrate a fourth example of the prior art wherein FIG. 10A is a perspective view and FIG. 10B is a cross-sectional view.

FIGS. 11A to 11D illustrate a probe pin of an inspection probe having an electric contact according to a first embodiment of the present invention wherein FIG. 11A is a cross-section view, FIG. 11B is an expanded view of the oval area in FIG. 11A, FIG. 11C is an expanded view of the circled area in FIG. 11B, and FIG. 11D is an expanded view of FIG. 11C;

FIGS. 16A and 16B illustrate an inspection probe according to a second embodiment of the present invention wherein FIG. 16A is a cross-sectional view and FIG. 16B is a plan view.

FIGS. 18A to 18C are schematic views of probing according to the present invention wherein FIG. 18A is a perspective view, FIG. 18B is a side view, and FIG. 18C is a top view;

FIGS. 21A and 21B illustrate a second method for forming a roughness pattern on the tip of a probe pin according to the present invention;

FIGS. 22A to 22C illustrate the materials used for forming a roughness pattern on the tip of a probe pin according to the present invention wherein FIG. 22A shows a wrapping sheet having roughness pattern, FIG. 22B shows an enlarged SEM of surface of alumina ceramics, and FIG. 22C shows an example of silicon processing;

FIGS. 24A to 24O illustrate a second example of a method for preparing an inspection probe according to the present invention and the steps at which a roughness pattern can be formed on the tip of a probe pin;

FIGS. 26A and 26B illustrate the method for inspection according to the present invention being applied wherein FIG. 26A is a sectional view and FIG. 26B is a top view;

FIGS. 27A to 27C show graphs indicating the results of measuring the contact characteristics of the prior art and the present invention wherein FIG. 27A is a result of the related art, FIG. 27B is a result of using inspection probe according to the present invention, and FIG. 27C is a result of combining the use of inspection probe according to the present invention and cleaning of electrodes of semiconductor device;

DESCRIPTION OF THE PREFERRED EMBODIMENTS

The embodiments of the present invention will be described with reference to the drawings.

<First Embodiment>

Figure 1A:
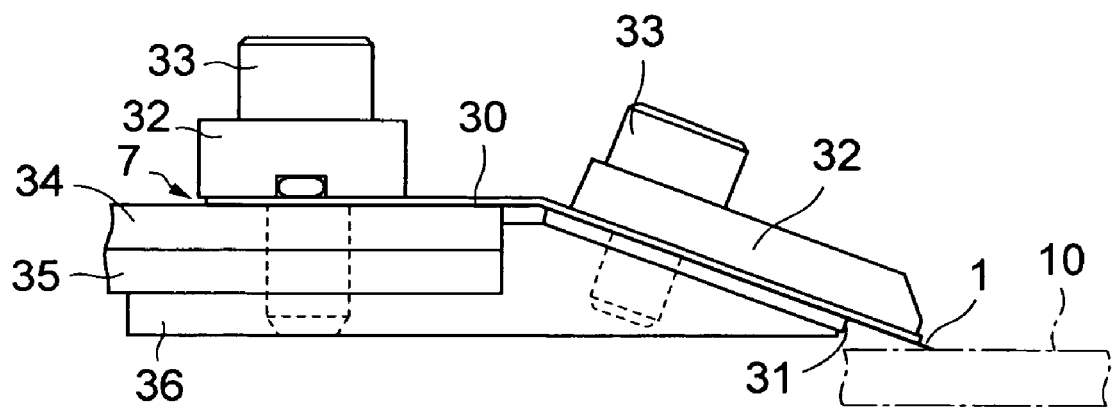
Figure 1B:
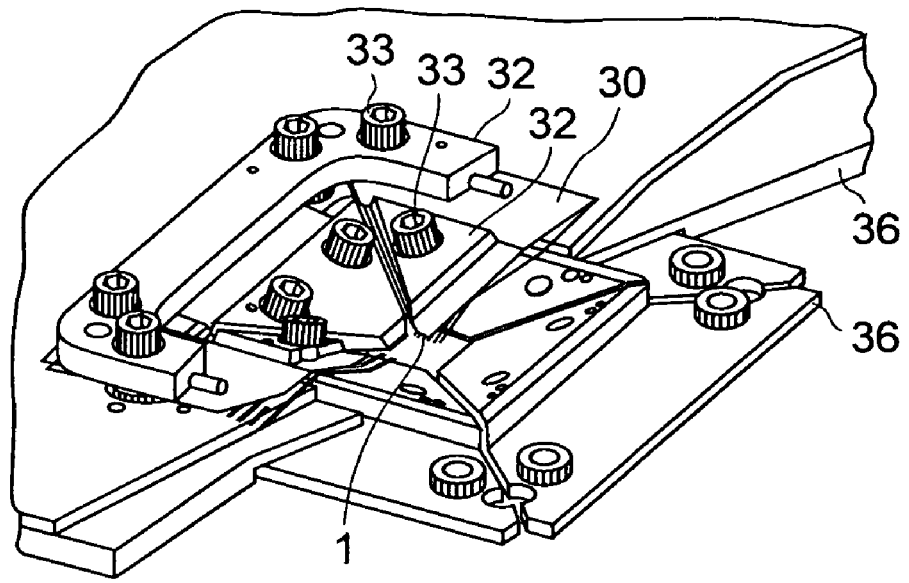
Figure 2A:
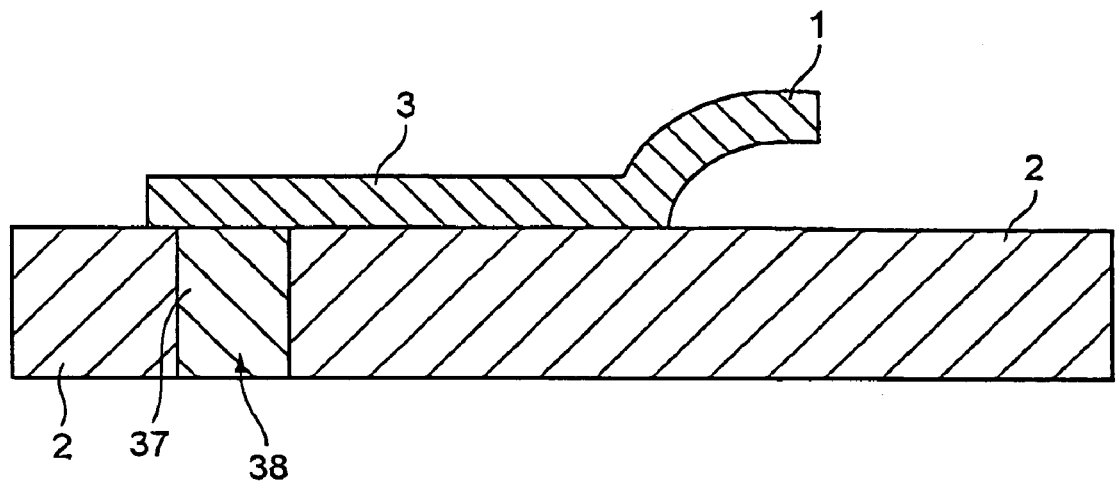
FIGS. 2A and 2B are cross-sectional views of a second example (1) of the prior art.
Figure 2B:
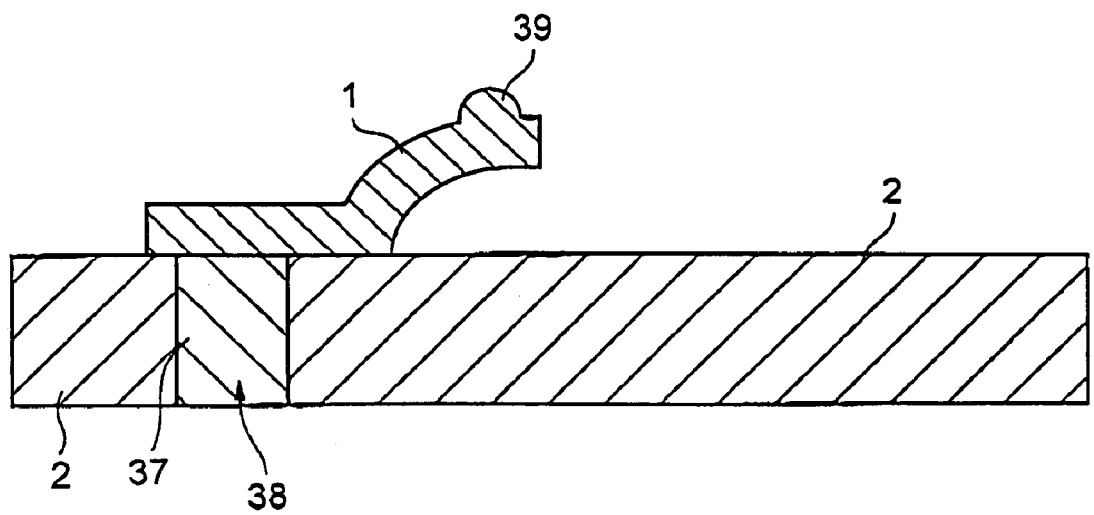
Figure 3:
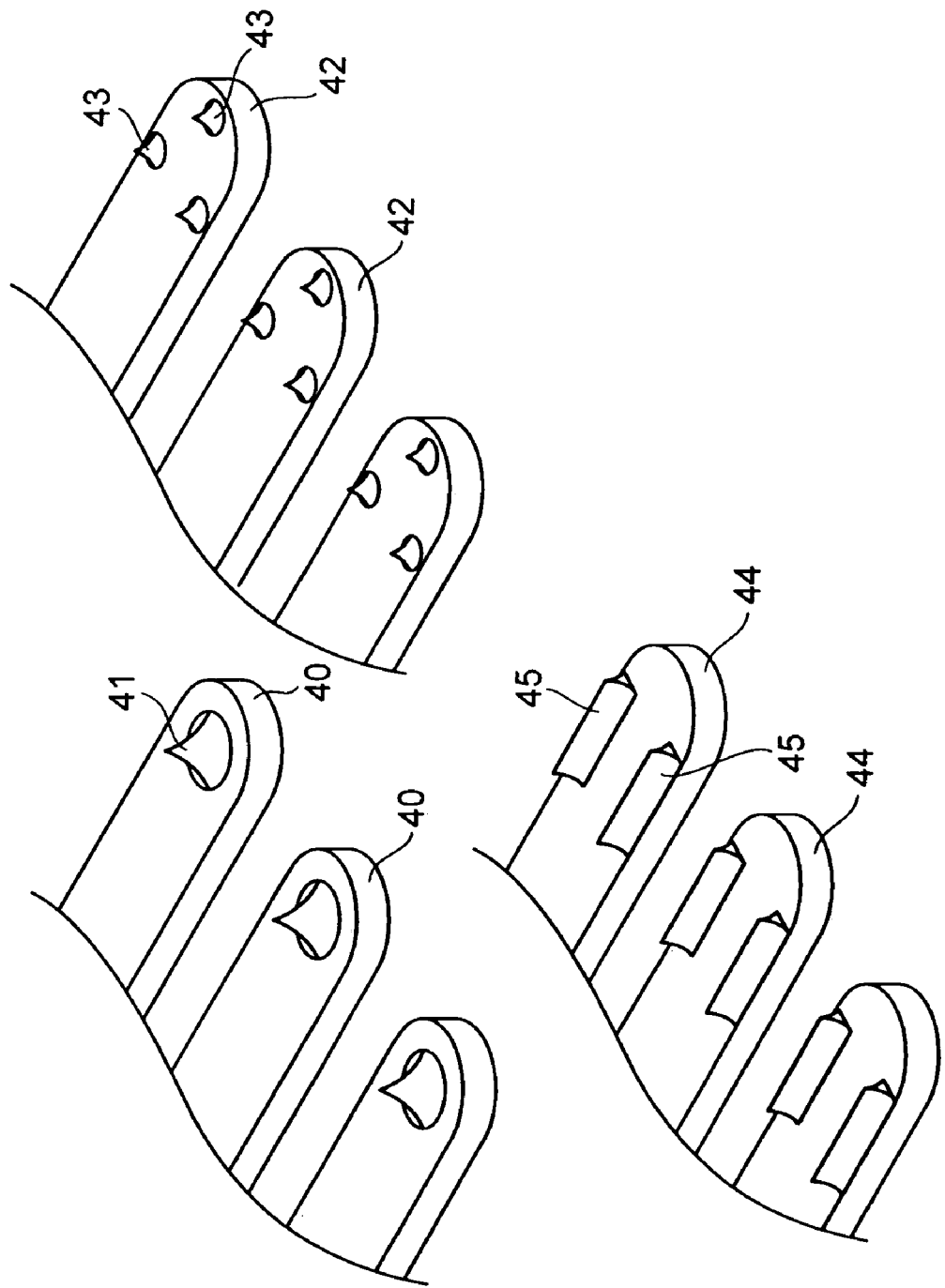
FIG. 3 is a perspective view of a second example (2) of the prior art.
Figures 4A, 4B:
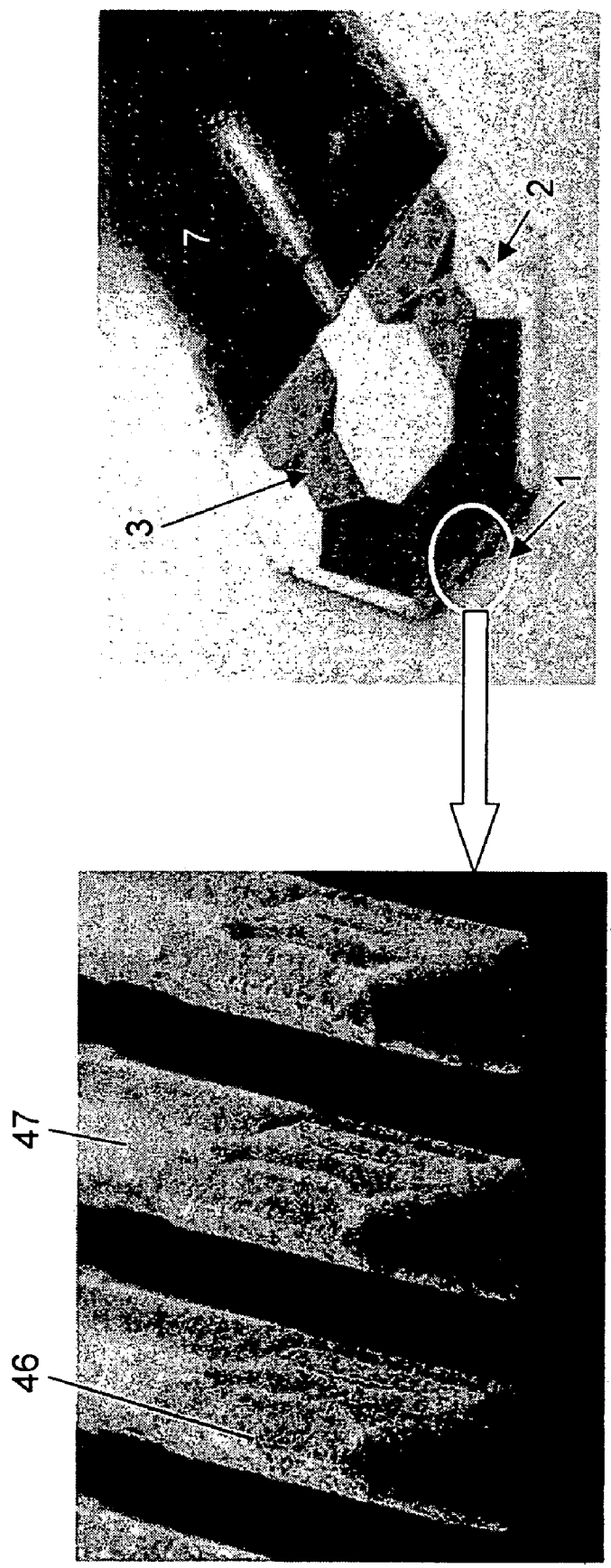
Figure 5B:
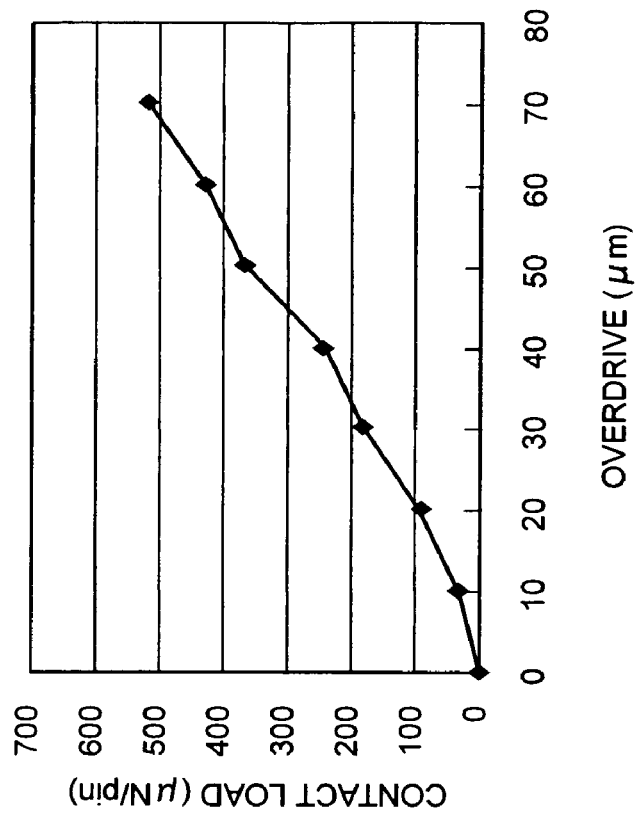
FIGS. 5A and 5B show the results of measurements of the basic performance of the specific example of the second example of the prior art.
Figure 5A:
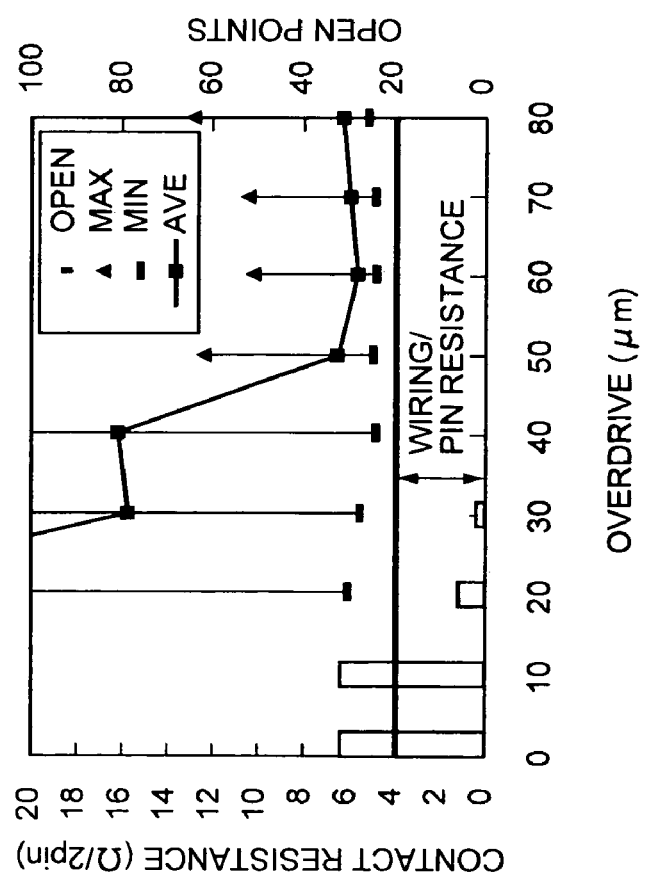
Figure 6:
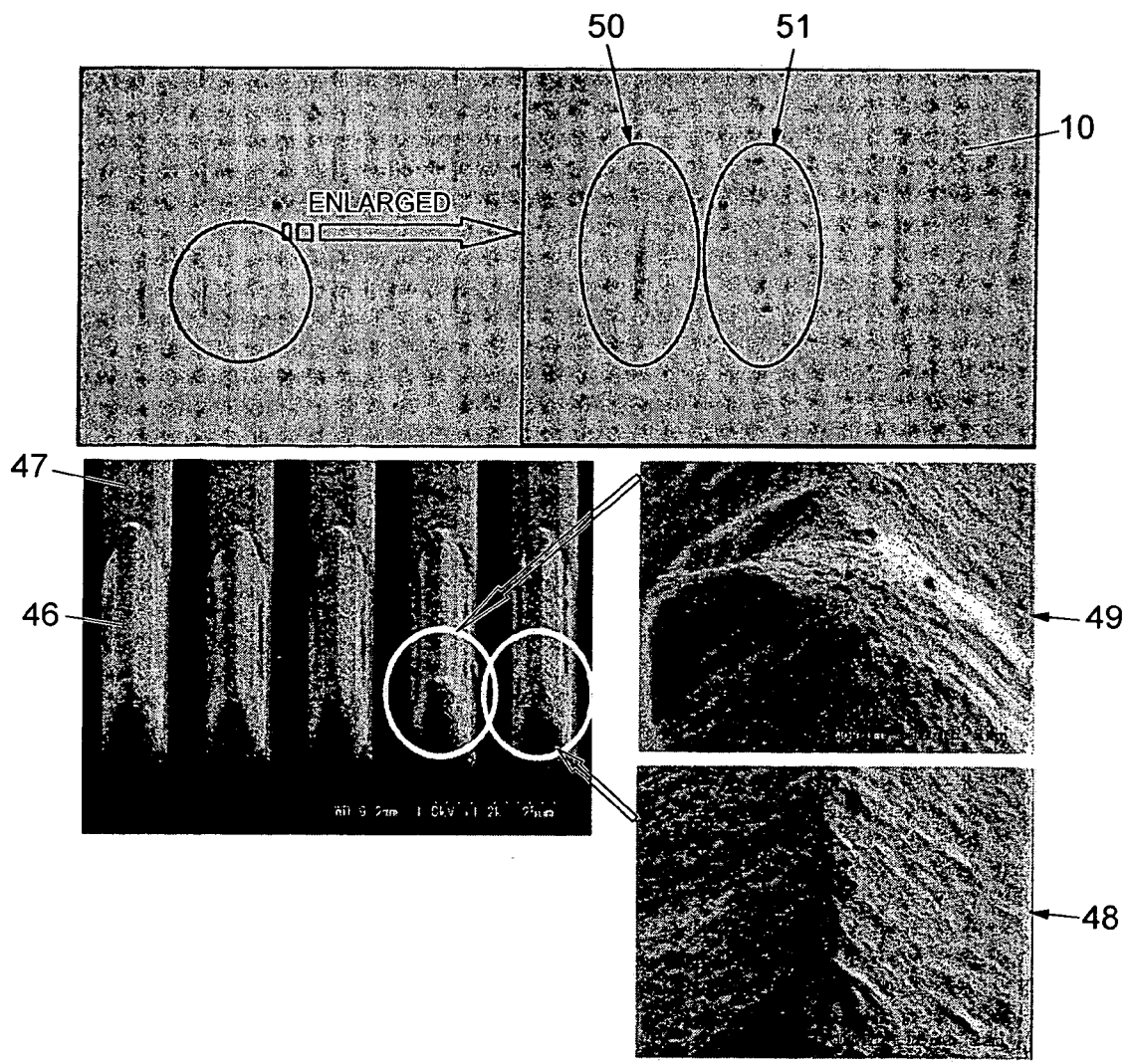
FIG. 6 shows the state after contact of the specific example of the second example of the prior art after the inspection probe makes contact.
Figure 7:
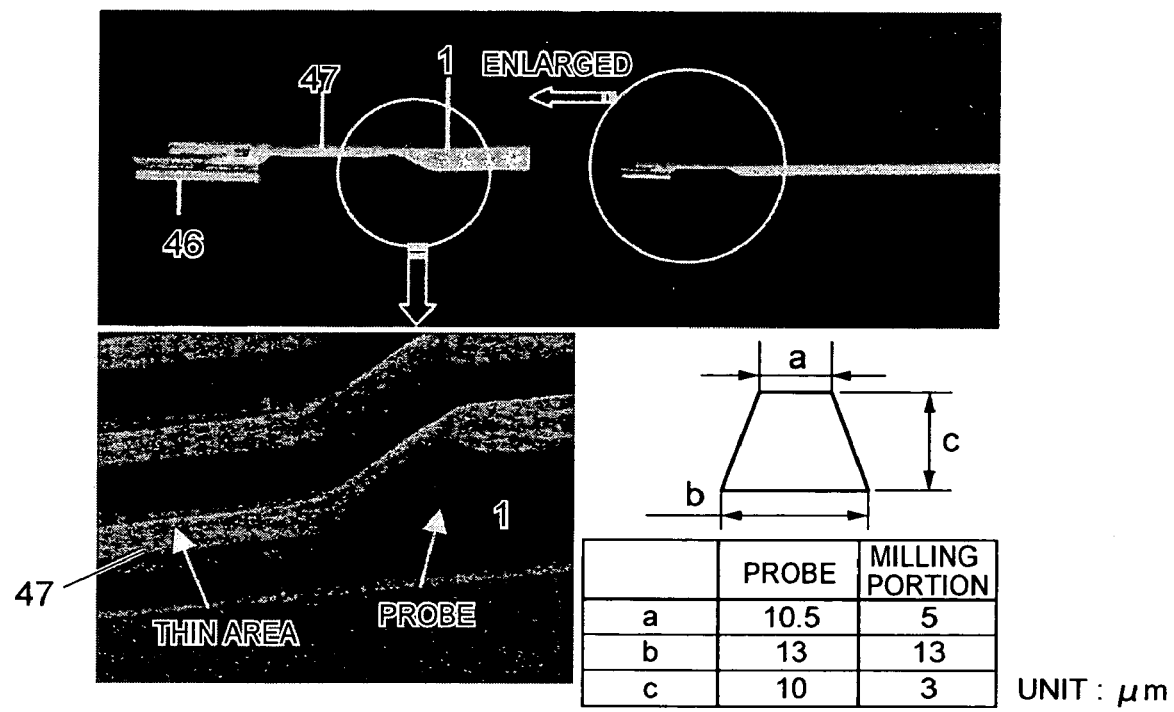
FIG. 7 is an external view of the tip of the probe pin of the specific example of the second example of the prior art.
Figure 8:
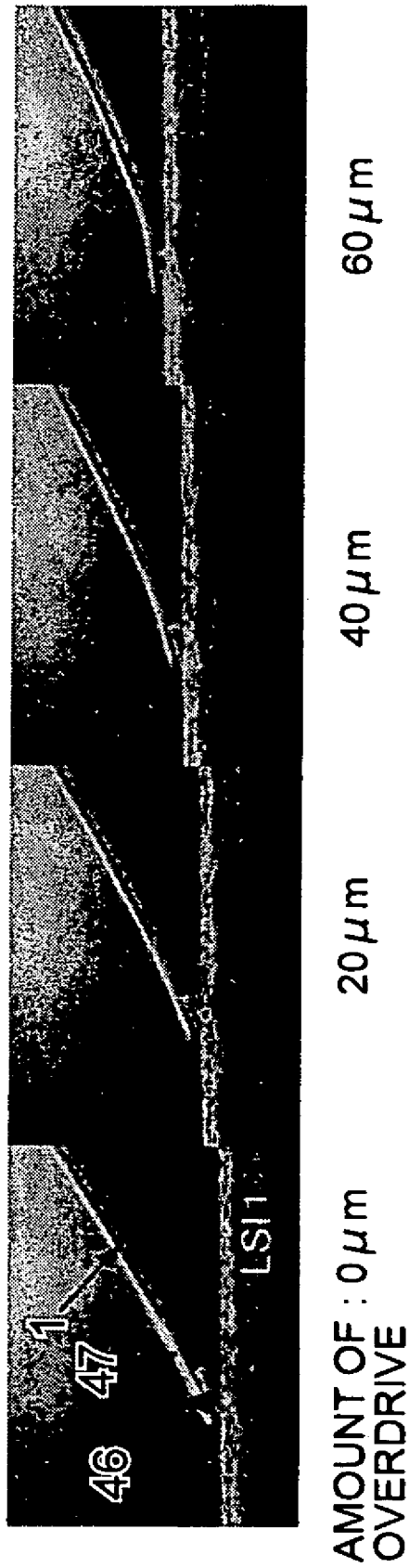
FIG. 8 illustrates the probing of the specific example of the second example of the prior art.
Figure 9:
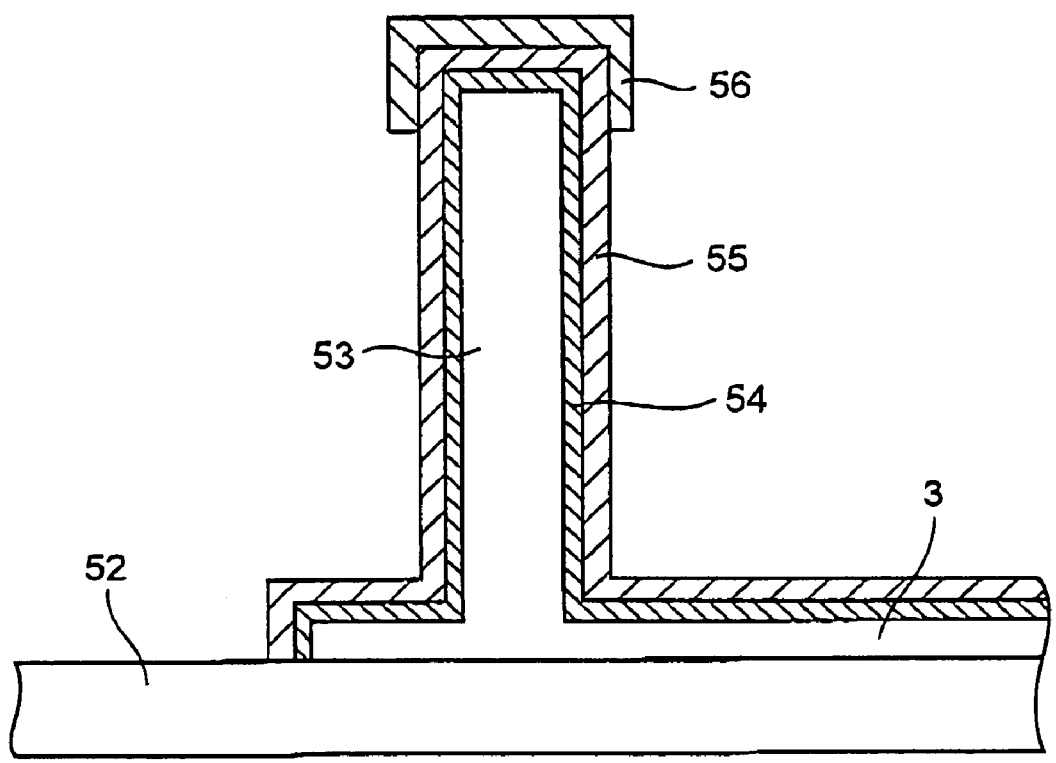
FIG. 9 is a cross-sectional view of a third example of the prior art.
Figure 10A:
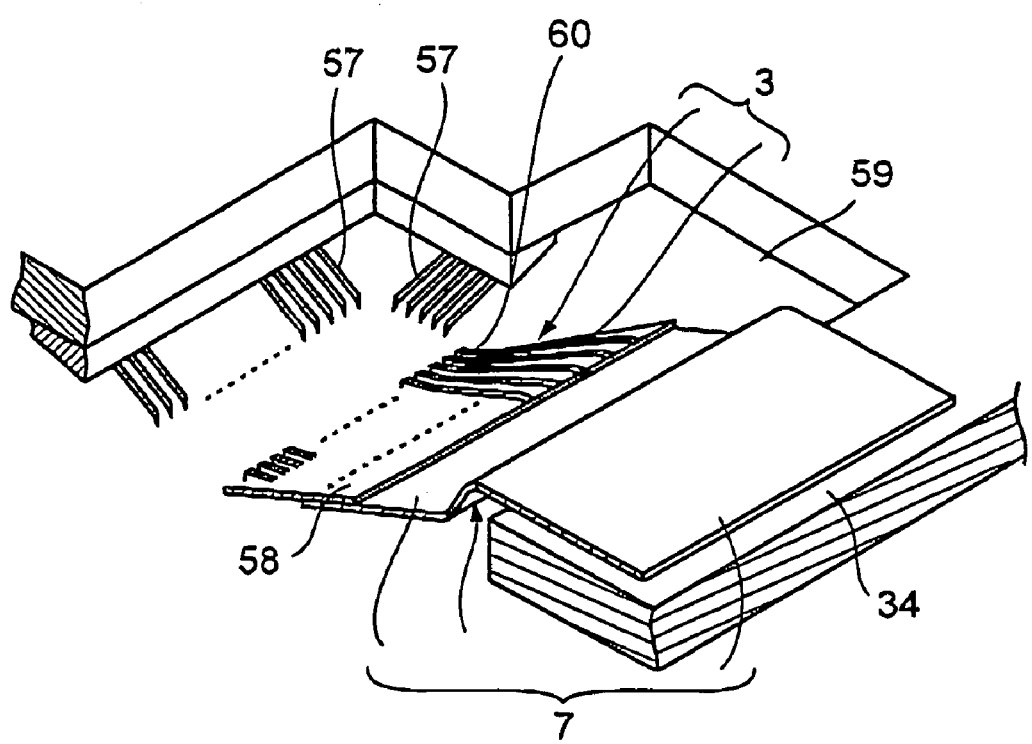
Figure 10B:
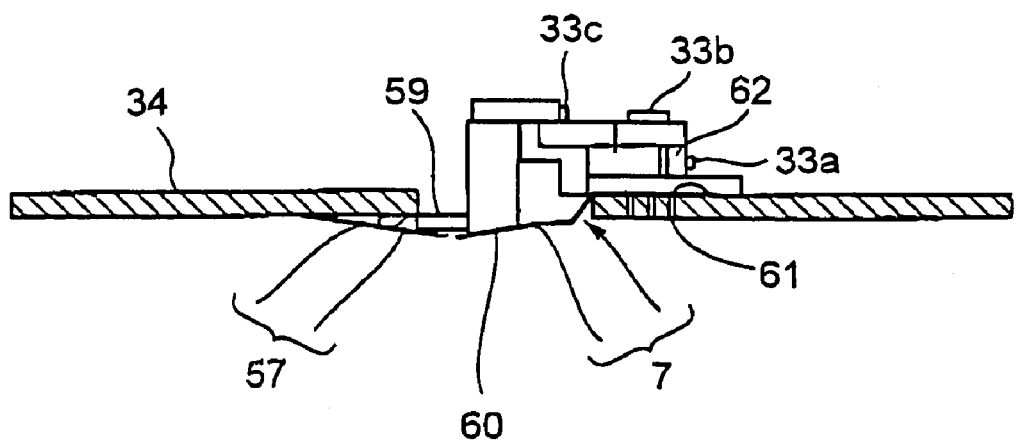
Figures 11C, 11D:
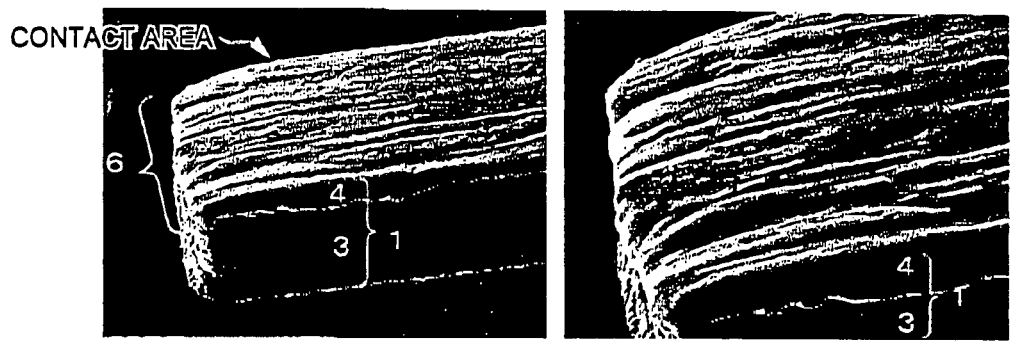
Figure 11B:
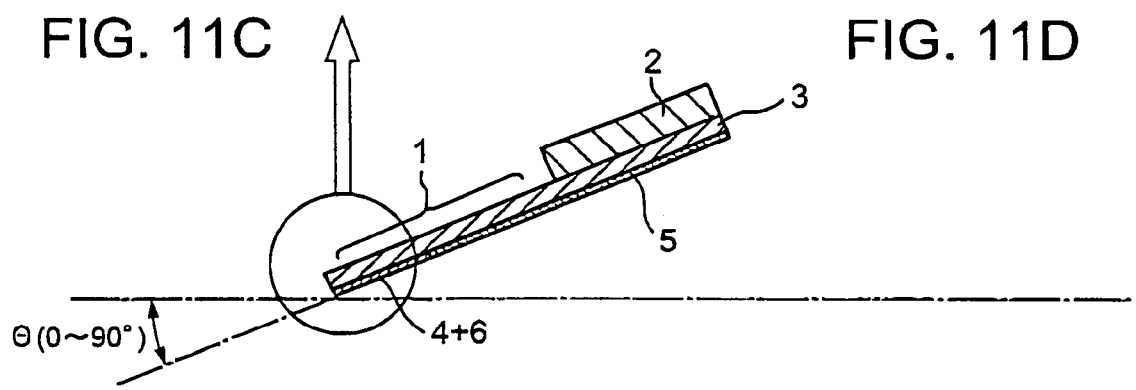
Figure 11A:
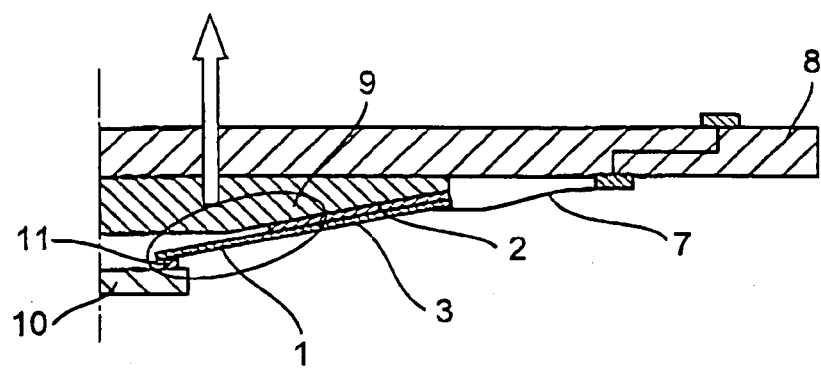

FIGS. 11A to 11D illustrate an inspection probe according to a first embodiment of the present invention. FIG. 11A is a cross-sectional view of the first embodiment of a probe pin of the inspection probe having an electric contact according to the present invention. FIGS. 11C and 11D are view showing the exterior of the fine marks of a roughness pattern formed on the tip of probe pins 1. Details of the inspection probe are described in JP-A-2003 207521. The inspection probe illustrated in FIG. 11A having electric contacts comprises probe pins 1 that come into contact with electrodes 11 of an external terminal of a semiconductor device 10 which is to be inspected, a base substrate 2 constituted of a ceramics plate, a glass ceramics plate, a glass plate, or a silicon plate coated with an insulating material, wiring layers 3 for expanding the electrode pitch disposed on the base substrate 2, a backup plate 9 for supporting the base substrate 2, an inspection substrate 8, and a flexible printed circuit (FPC) board 7 constituted of a polyimide.

Now the structure of the probe pins 1 and the wiring layers 3 will be described with reference to FIGS. 11C and 11D. The probe pins 1 and the wiring layers 3 are simultaneously electroplated with a resilient metal layer, such as nickel, nickel/iron alloy, nickel/cobalt alloy, or a nickel/manganese alloy to form a low-resistance metal layer 5 (gold/palladium alloy) on the wiring layer 3 by electroplating or sputtering.

Figure 22C:
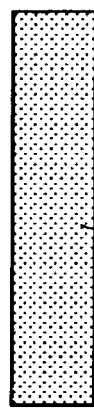
Figure 22B:
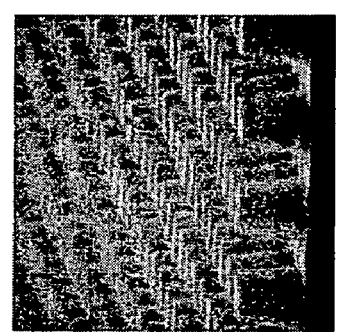
Figure 22A:
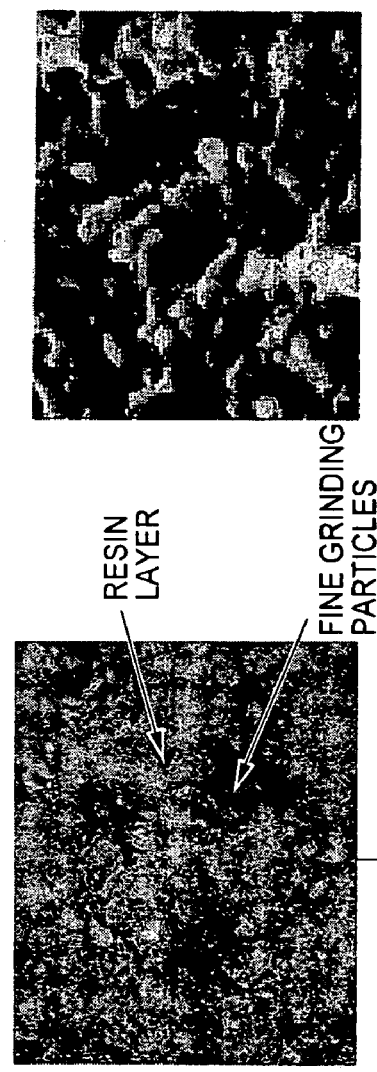

After completing the step of forming a second metal layer illustrated in FIGS. 23A to 23M and FIGS. 24A to 24O, the tips of the probe pins 1 are pushed into a wrapping sheet (abrasive paper) having fine metal particles, a ceramic substrate having appropriate porosity, or a silicon substrate having appropriate preformed bumps to form a roughness pattern 6, illustrated in FIGS. 22A, 22B, and 22C. The roughness pattern 6 may be formed by moving the probe pins 1 horizontally, vertically, or diagonally while pushing against the wrapping sheet, the ceramic substrate, or the silicon substrate.

Details of the step of forming the roughness pattern 6 will be described below. The step of forming the roughness pattern 6 may be performed after any of the following steps: the step of removing a part of a resist layer 26, illustrated in FIGS. 23A to 23M and 24A to 24O, the step of removing the probe pin 1 from a bed 28, illustrated in FIGS. 24A to 24M, and the step of attaching the probe pins 1 to an inspection substrate, illustrated in FIGS. 23A to 23M and 24A to 24O.

If the electrodes 11 to be inspected by the probe pins 1 have a pitch of 20 µm and a electrode size of 12 µm, the contact angle of the probe pins 1 is 15° and the overdrive is 70 µm, the length of the roughness pattern 6 in the longitudinal direction of the probe pins 1 should be 38 µm or more because the roughness pattern 6 must be longer than the sum of the scrubbing amount (the distance the probe moves relative to the electrode: 14 µm), the electrode size (12 µm), the positional tolerance of the probe pins 1 in the longitudinal direction (±5 µm), and the positional tolerance of the electrodes 11 of the semiconductor device 10 (±1 µm). The length of the roughness pattern 6 in the width direction should preferably be the same as the width of the probe pins 1.

Figure 19:
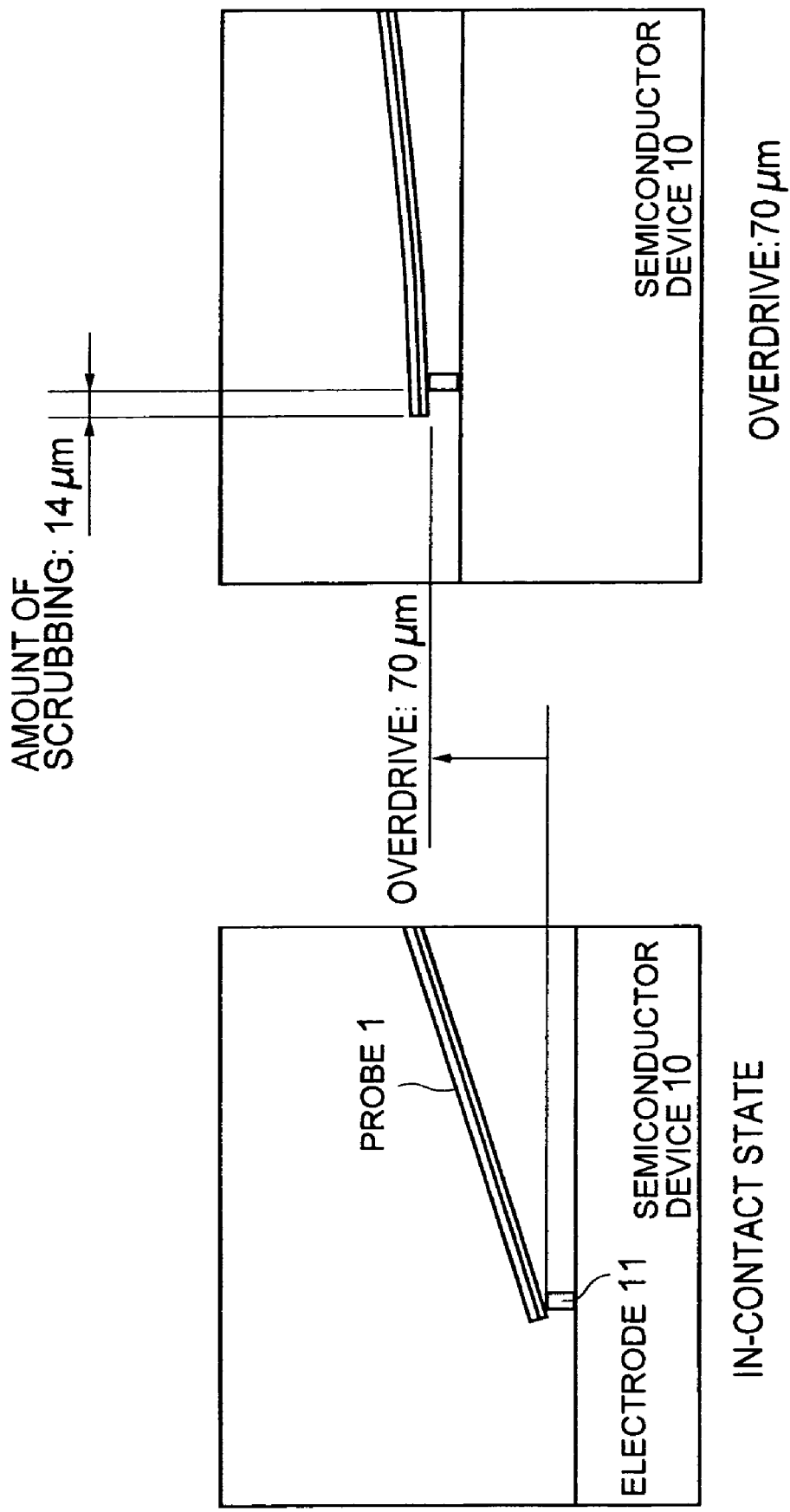
FIG. 19 illustrates the amount of scrub caused by probing according to the present invention.

The length of the roughness pattern 6 in the longitudinal direction of the probe pins 1 is further described below. FIG. 19 shows side views of one of the electrodes 11 of the semiconductor device 10 and one of the probe pins 1 while they are in contact and while an overdrive of 70 µm is applied. As illustrated in the drawing, the scrubbing amount is the distance the probe pins 1 move while rubbing against the electrodes 11 after coming into contact with the electrodes 11. The electrode size is the size of the area of one of the electrodes 11 contacted by one of the probe pins 1 after an overdrive is applied (at inspection). The positional tolerance in the longitudinal direction of the probe pins 1 and the positional tolerance for the electrodes 11 must be taken into consideration so as to maintain the initial positional relationship between the probe pins 1 and the electrodes 11. The positional accuracy of the probe pins 1 in the longitudinal direction may be taken into consideration to position the probe pins 1 so that they protrude out for about half the length of the electrodes 11 (i.e., 6 µm) from the beginning.

The contact angle of the probe pins 1 of the inspection probe may be set between 0° to 90°.

After the roughness pattern 6 is formed in the above-mentioned area of the probe pins 1, a precious metal layer 4 is formed over this area by plating or sputtering. The low-resistance metal layers 5 may be formed over the wiring layers 3 before or after the roughness pattern 6 is formed. The precious metal layer 4 disposed over the roughness pattern 6 at the tip of each of the probe pins 1 and the metal layers 5 disposed over the wiring layers 3 may be composed of the same material or may be composed of different materials. In other words, for example, the metal layers 5 disposed over the wiring layers 3 may be composed of pure gold (99.99% gold) and the roughness pattern 6 may be covered with an alloy, or the roughness pattern 6 and the wiring layers 3 may both be covered with an alloy.

Figure 12:
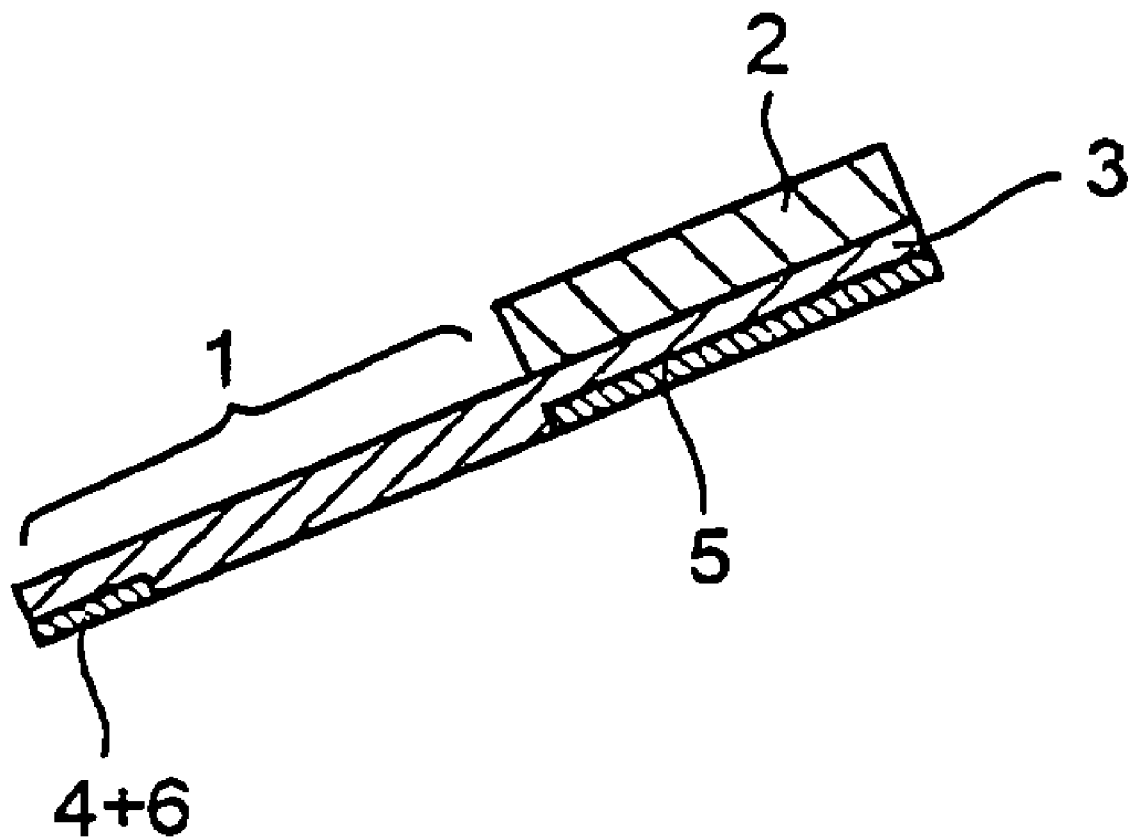
FIG. 12 is a cross-sectional view of the structure and the tip and a wiring layer of a probe pin of an inspection probe according to the first embodiment.

When the same material is used for covering both the wiring layers 3 and the roughness pattern 6, the precious metal layers 4 and the metal layers 5, as illustrated in FIG. 11, may be formed simultaneously and some of the steps of producing the inspection probe can be omitted. When different materials are used for covering the wiring layers 3 and the roughness pattern 6, the areas to be covered with the precious metal layers 4 and the areas to be covered with the metal layers 5 may be separated, as illustrated in FIG. 12. By separating the areas, the process for producing the inspection probe will become simplified.

Figure 14:
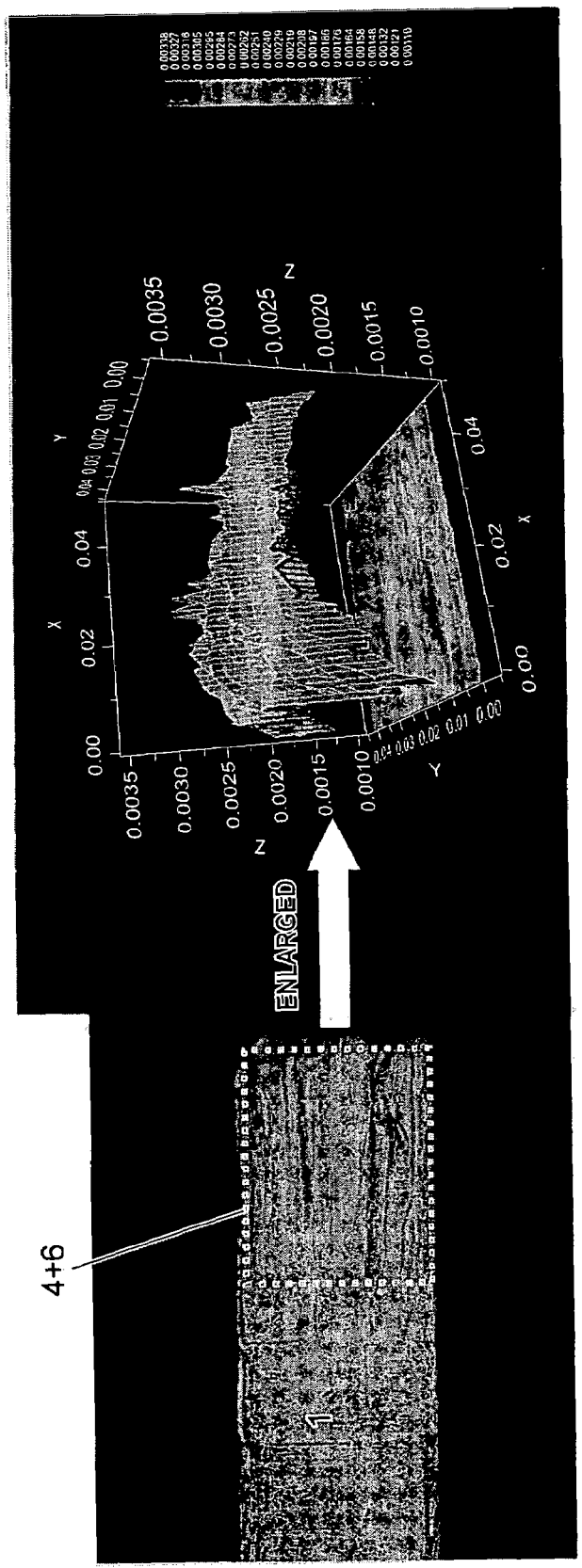
FIG. 14 illustrates a first example of the roughness pattern of the probe pin according to the present invention.
Figure 15:
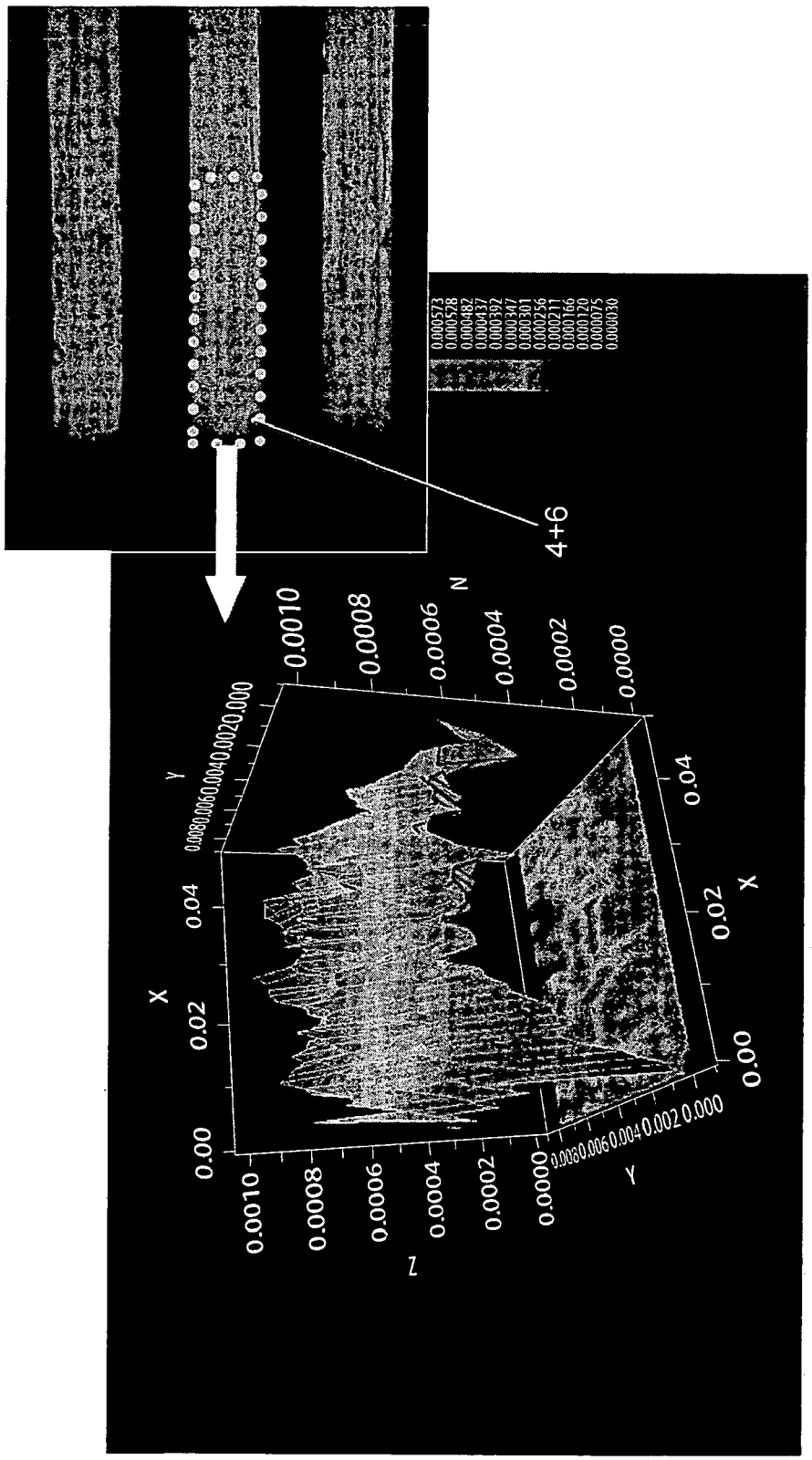
FIG. 15 illustrates a second example of the roughness pattern of the probe pin according to the present invention.

The thickness of the precious metal layer 4 on the roughness pattern 6 is preferably between 0.05 to 3 µm so that the fine marks of roughness pattern 6 emerges through the precious metal layer 4 without being buried. FIG. 14 illustrates the results of measuring the dimensions of the fine marks of the roughness pattern 6 on the tips of the probe pins 1 illustrated in FIGS. 11A to 11D. The area indicated with a square in FIG. 14 was measured by scanning a non-contact three-dimensional laser measuring device in the X- and Y-directions at 0.1 μm intervals. FIG. 14 illustrates the result of extracting 84 points showing that the fine marks of the roughness pattern 6 have magnitudes of 0.01 to 0.67 μm. FIG. 15 illustrates the results of measuring the dimensions of the fine marks of the roughness pattern 6 formed at the tips of the probe pins 1 for a 20 μm-pitch. The fine marks of the roughness pattern 6 have magnitudes of 0.04 to 0.62 μm. For a copper electrodes prepared by chemical mechanical polishing (CMP) after electrolytic plating, the oxidation film thickness is 46 angstroms and the size of the fine marks of the roughness pattern 6 should preferably be 1 μm or less. The preferable dimensions of the roughness pattern 6 differ depending on the thickness and property of the oxidation films formed on the electrodes 11. However, in general, the roughness pattern 6 should be ten times the thickness of the oxidation films.

Figure 13:
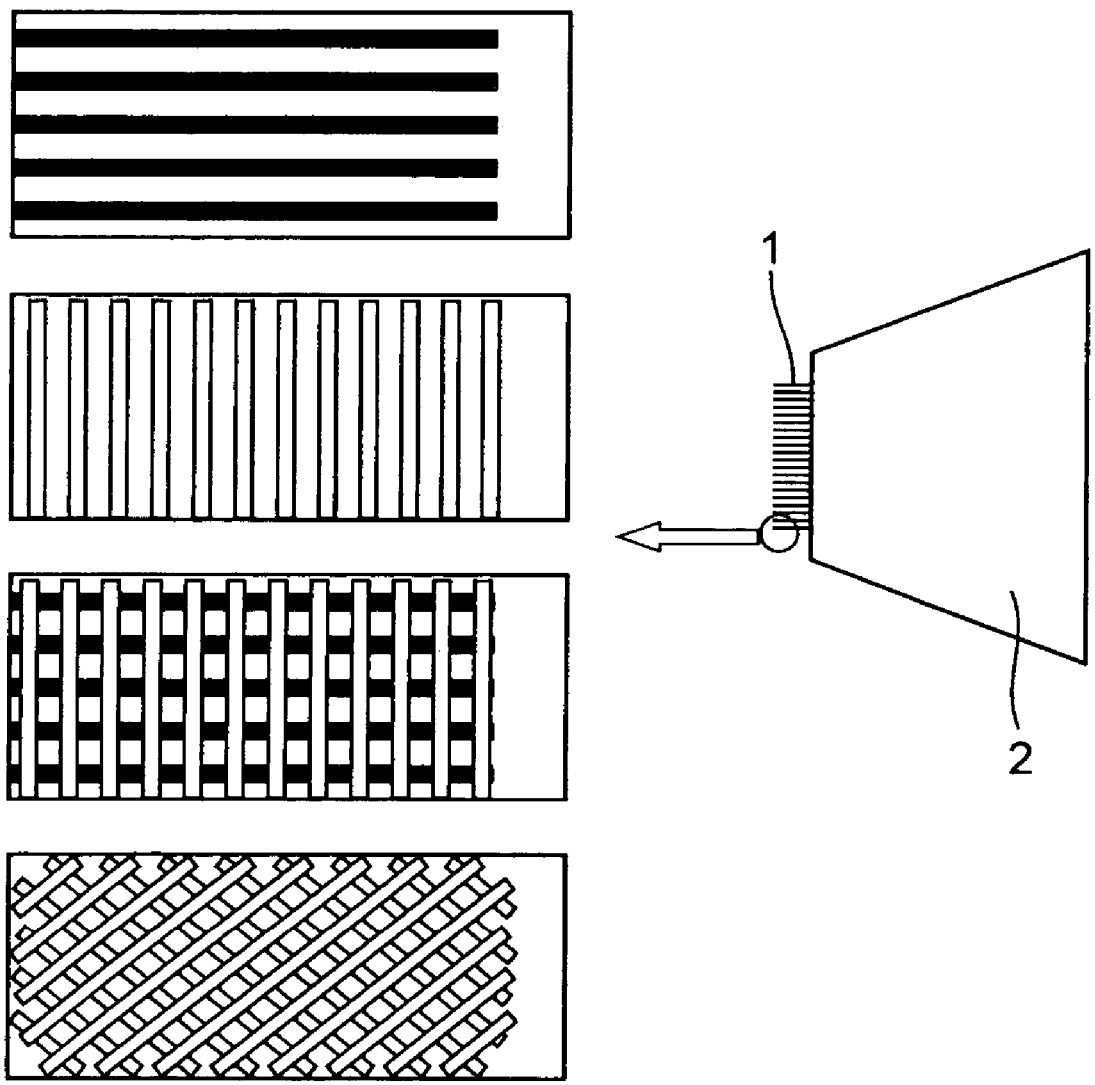
FIG. 13 illustrates fine roughness patterns of the probe pins according to the present invention.

As illustrated in FIG. 13, the fine marks of the roughness pattern 6 may be formed in various directions, such as in the same direction as the scrubbing, in the direction orthogonal to the direction of the scrubbing, in a grid, in a diagonal grid, or in random directions. It is most preferable to use probe pins 1 that have the roughness pattern 6 in the same direction as the scrubbing since dust is generated from the electrodes 11 after the probe pins 1 of the inspection probe according to the present invention come into contact with the electrodes 11 of the semiconductor device 10.

Next, the effectiveness of coating the roughness pattern 6 formed on the tips of the probe pins 1 with the precious metal layer 4 and the effectiveness of cleaning the electrodes 11 of the semiconductor device 10 are described with reference to the experimental results.

First, the probing mechanism will be described with reference to the schematic view of a probing process in FIGS. 18A, 18B, and 18C. FIGS. 18B and 18C are side and top views, respectively, of before and after probing when contact is made with the electrodes 11, which are protruding metals. FIG. 18A is a perspective view. When an overdrive (penetration) is applied to the probe pins 1, the probe pins 1 elastically deform and scrub the protruding metal electrodes 11 to provide an electric contact.

Figures 27A, 27B, 27C:
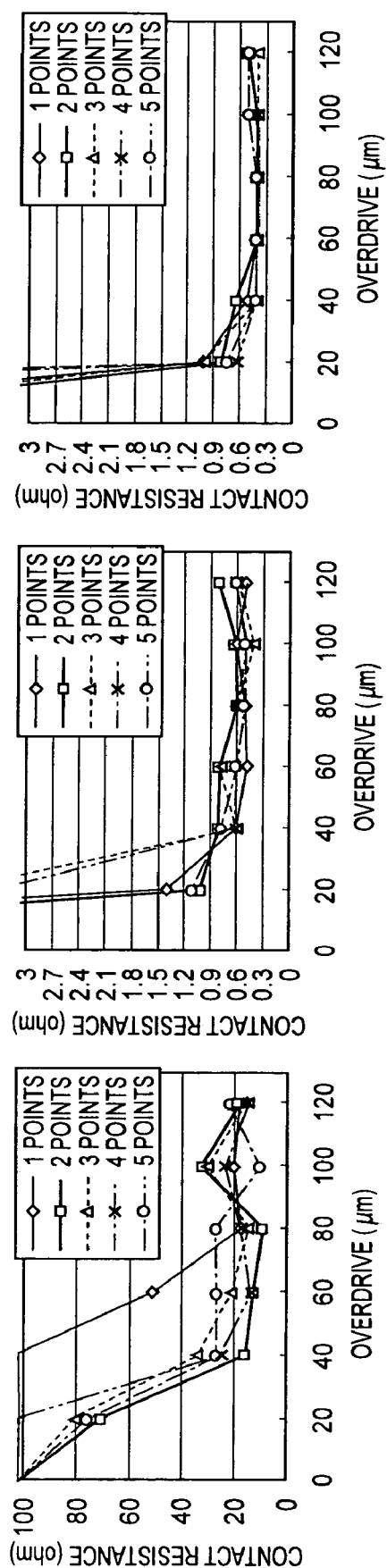

FIGS. 27A, 27B, and 27C show graphs indicating the measurement results of the contact resistance in respect to an overdrive when the electrodes 11 of the semiconductor device 10 are constituted of copper and have oxidation films. FIG. 27A shows the measurement results of electric contacts of known probe pins 1 (the base material of the probe pins having a flat shape). Although conductivity is obtained when an overdrive of 60 μm or more is applied, the absolute value of the resistance varies widely between 10 and 40 Ω and causes the contact state to be unstable. FIG. 27B shows the measurement results of the contact resistance of the probe pins 1 having the roughness pattern 6 formed on the tips. When the overdrive is 40 μm or more, conductivity is obtained and a stable contact of 1 Ω or less is also obtained. FIG. 27C shows the experimental results of the contact resistance of the probe pins 1 having the roughness pattern 6 and the electrodes 11 of the semiconductor device 10 being cleaned. In this case, the probe pins 1 used are the above-mentioned probe pins 1 having the roughness pattern 6 on the tips. Conductivity is obtained when an overdrive of 20 μm or more is applied, and a stable contact of 0.4 Ω is obtained when an overdrive of 60 μm or more is applied.

Figure 28:
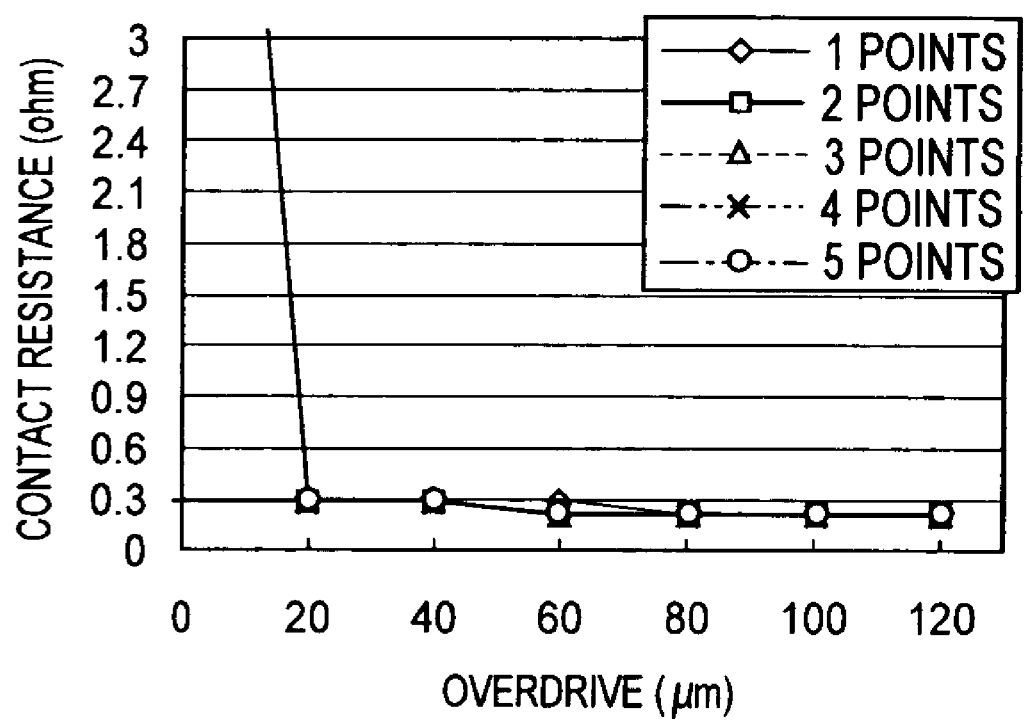
FIG. 28 shows a graph indicating a result of measuring the contact characteristics of the prior art and the present invention, i.e., the result of using inspection probe according to the present invention while optimizing conditions for cleaning electrodes of semiconductor device.

FIG. 28 shows the experimental results of the probe pins 1 having electric contacts (the roughness pattern 6 formed on the tips of the probe pins 1 and plated with gold alloy) according to the present invention while the conditions for the cleaning process of the electrodes 11 of the semiconductor device 10 are set to appropriate values. The results indicate that an overdrive of 20 μm or more is applied and an extremely stable contact of 0.3 Ω is obtained. The conditions for the cleaning process will be described together with the details of the method for inspection.

As indicated by the experimental results, by using the probe pins 1 each having the appropriate roughness pattern 6 on the tip and each having at least one precious metal layer 4 disposed over the roughness pattern 6, a stable contact of 1 Ω or less is obtained. Furthermore, by cleaning the electrodes 11 of the semiconductor device 10, an extremely good contact of 0.3 Ω is obtained when an overdrive of 20 μm or more is applied. Accordingly, it is extremely effective to combine the use of the probe pins 1 having the appropriate roughness pattern 6 on the tips and having the precious metal layers 4 disposed over the roughness pattern 6 on the tips and the process of cleaning of the electrodes 11 of the semiconductor device 10.

<Second Embodiment>

Figure 16A:
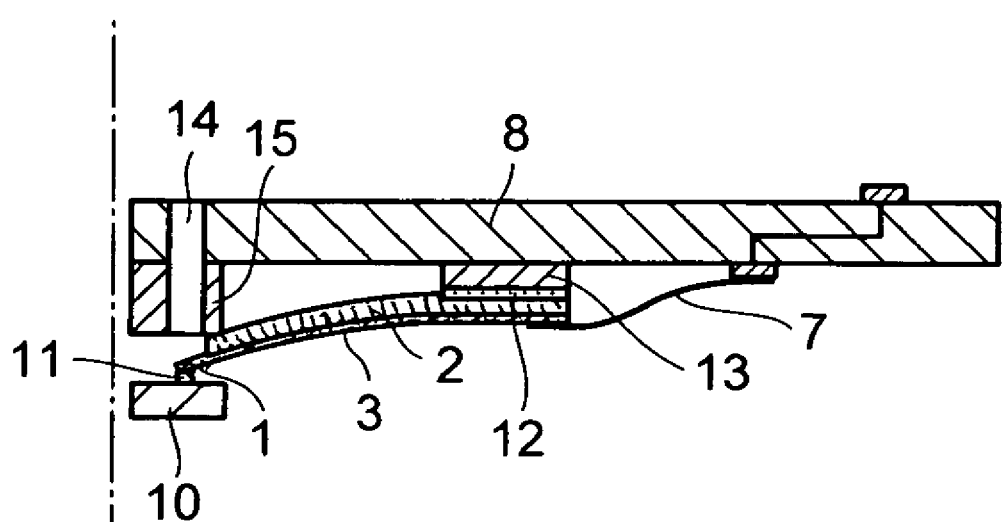
Figure 16B:
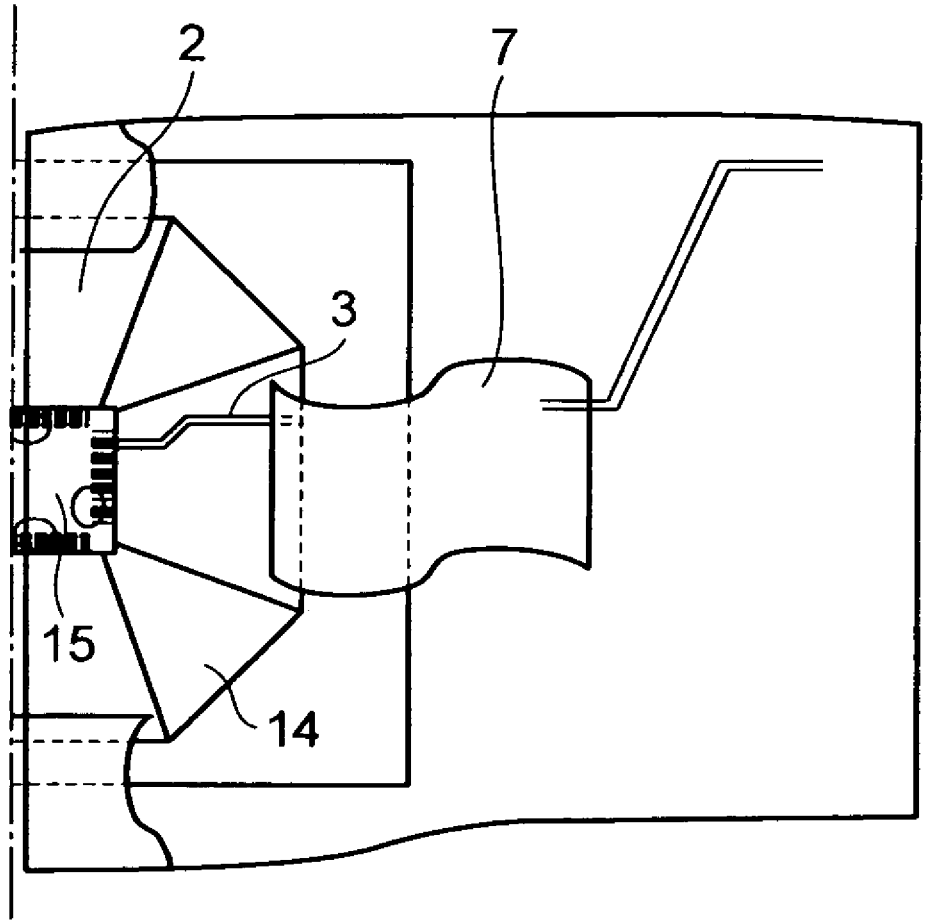

FIGS. 16A and 16B illustrate a second embodiment of an inspection probe according to the present invention. The structure of the inspection probe is disclosed in JP-A-2003 322664. The inspection probe according to the first embodiment of the present invention, as illustrated in FIG. 11, is prepared by assembling four substrates. To do so, the four substrates must be aligned highly accurately and a backup plate 9 must be prepared with great accuracy. However, by employing the structure according to the second embodiment, the assembly of the inspection probe can be simplified while further improving the contact reliability. The required accuracy of the backup plate 9 can be reduced and, as a result, the production cost can be reduced. The structures of the tips of probe pins 1 and low-resistance metal layers 5 of the inspection probe according to the second embodiment are the same as the structures of those of the first embodiment.

The difference between the first and the second embodiments is described in detail in JP-A-2003 322664. Therefore, the difference will be briefly described below. A base substrate 2 and the probe pins 1 disposed on the periphery of the base substrate 2 are produced at once. The base substrate 2 is thinned to about 100 μm and then a support substrate 13 is attached to the periphery of the base substrate 2 by interposing an adhesive layer 12 between the base substrate 2 and the support substrate 13. Finally, this base substrate 2 is attached to an inspection substrate 8. A convex support plate 15, which provides support at its edges, is attached to the center of the inspection substrate 8. The support plate 15 has a through hole 14. The angle of the probe pins 1 relative to electrodes 11 of a semiconductor device 10 can be adjusted to a predetermined angle at the supporting point of the support plate 15 and the point where the base substrate 2 starts to bend. Unlike the first embodiment, the probe pins 1 are disposed on the four sides of the base substrate 2 at once and the base substrate 2 is attached to the inspection substrate 8. Therefore, the positional accuracy of the probe pins 1 after assembly is high. Moreover, if the probe pins 1 are damaged, the inspection probe can be easily repaired by replacing the entire base substrate 2.

By the inspection probe according to the present invention and the cleaning process for the electrode of the semiconductor device, good contact can be maintained for an electrode made of a material such as aluminum, copper, or an aluminum/silicon/copper alloy, having an oxidation film and electrodes having an extremely fine pitch in a peripheral arrangement.

<Third Embodiment>

Figure 17:
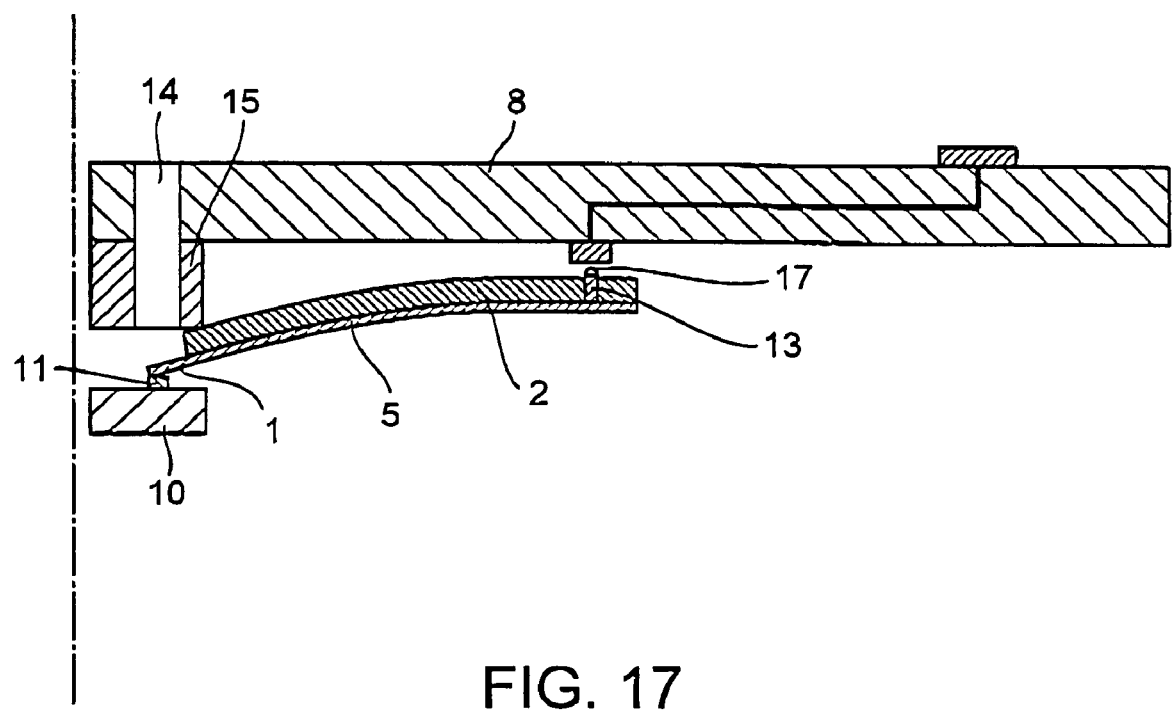
FIG. 17 illustrates a third embodiment of an inspection probe according to the present invention.

FIG. 17 illustrates an inspection probe according the third embodiment of the present invention. An inspection probe having a similar structure is disclosed in JP-A-2002 286758. However, the inspection probe according to this embodiment is a modification of the inspection probe according to the second embodiment and differs from the inspection probe according to JP-A-2002 286758. More specifically, a through hole having a predetermined shape (e.g., 100 to 150 μm diameter for 250 μm pitch) is formed with a laser on the outermost periphery of a base substrate 2, where the pitch is expanded by a pitch-expansion wiring layers 5 of the base substrate 2. Subsequently, the through hole is filled with metal by sputtering, electrolytic plating, or electroless plating to provide a through-substrate electrode 16. A bump 17 is formed on the end of the through-substrate electrode 16 so that the bump 17 connects with a connection pad of the inspection substrate. Instead, a mechanism may be provided to hold an anisotropic conductive sheet between the through-substrate electrode and the inspection substrate with constant pressure applied from above. The structure according to this embodiment allows short wiring and thus is capable of transmitting signals well in high frequency areas. Moreover, since a FPC board 7 becomes unnecessary, the production cost is reduced.

Method for Forming a Fine Roughness Pattern

A method for forming a roughness pattern 6 on the tips of probe pins 1 of an inspection probe according to the present invention, illustrated in FIGS. 11A to 15, will be described in detail with reference to FIGS. 20, 21A, 21B, 22A to 22C, 23A to 23M, and 24A to 24O.

Figure 20:
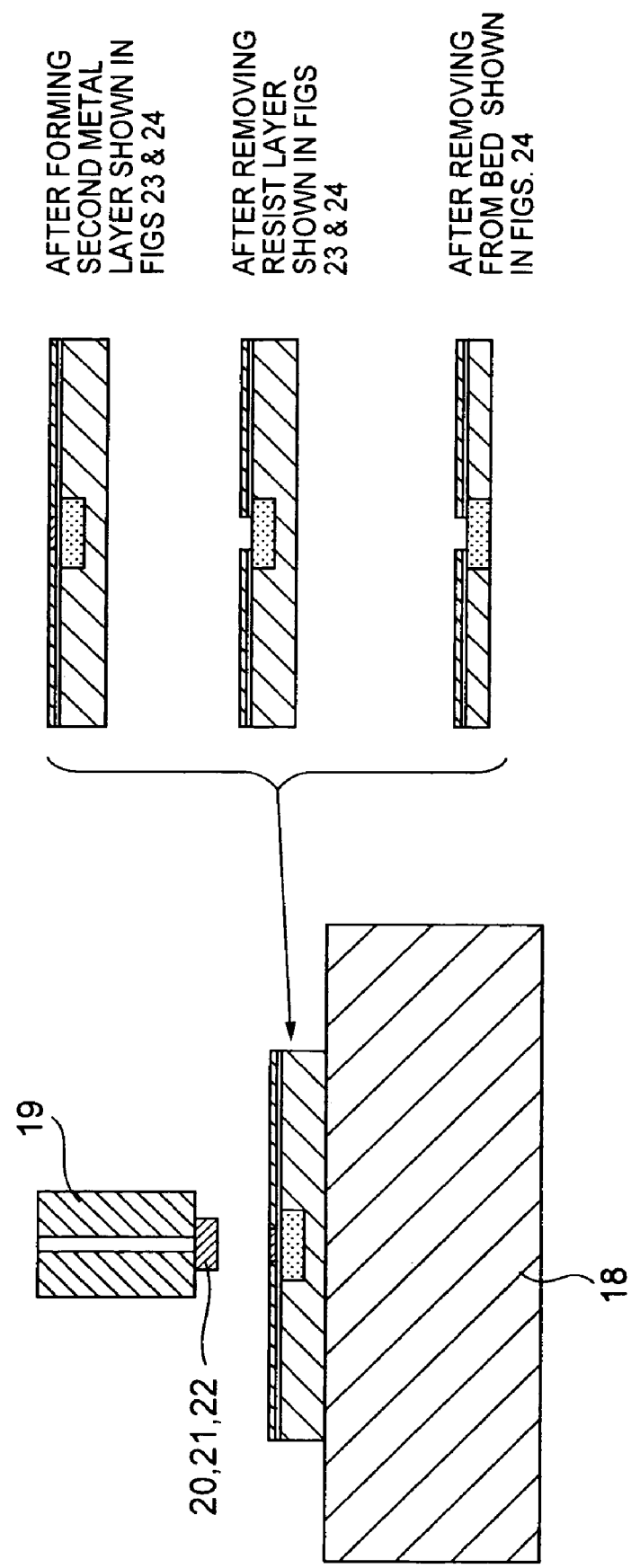
FIG. 20 illustrates a first method for forming a roughness pattern on the tip of a probe pin according to the present invention.

There are two methods for roughness pattern 6 on the tips of the probe pins 1 of an inspection probe according to the present invention. In the first method, as illustrated in FIG. 20, the base material of the probe pins 1 is disposed on an absorption stage 18 and a wrapping sheet 20 having a roughness pattern on its surface, as illustrated in FIGS. 22A, 22B, and 22C, an alumina ceramics layer 21, and a silicon processing substrate 22 are attached to a collet 19. The collet 19 is pushed against the probe pins 1 to transfer the roughness pattern to a predetermined area at the tips of the probe pins 1. The roughness patterns may be formed by moving the collet 19 horizontally, vertically, or diagonally while pushing against the probe pins 1.

Figure 23A:
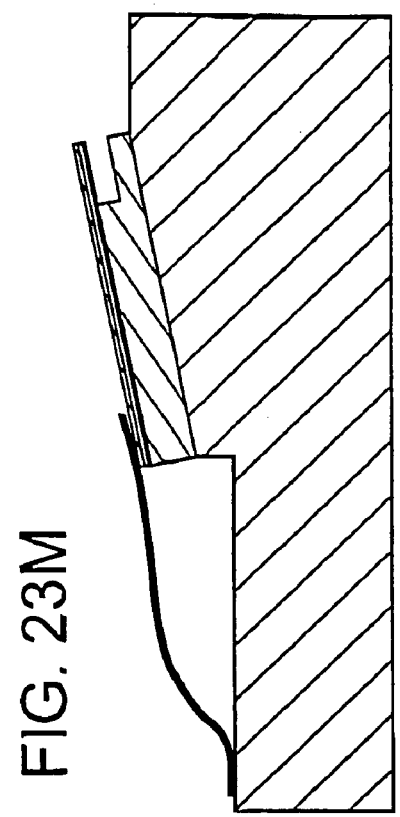
FIGS. 23A to 23M illustrate a first example of a method for preparing an inspection probe according to the present invention and the steps at which a roughness pattern can be formed on the tip of a probe pin.
Figure 23B:
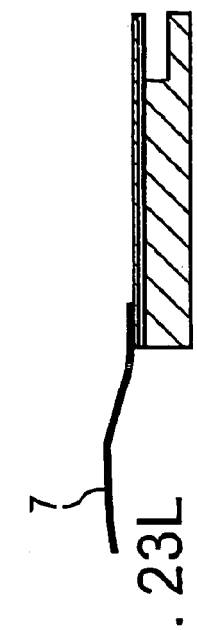
Figure 23C:
Figure 23D:
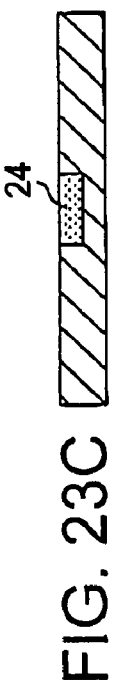
Figure 23E:
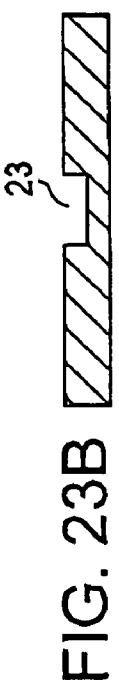
Figure 23F:
Figure 23G:
Figure 23H:
Figure 23I:
Figure 23J:
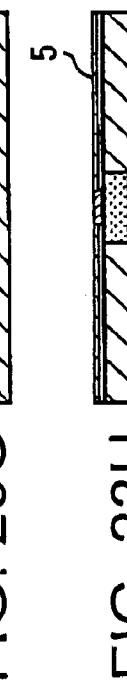
Figure 23K:
Figure 23L:
Figure 23M:
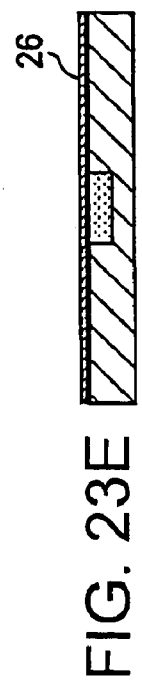

The timing to perform the step of forming a roughness pattern during the probe production process is described below. The probe production process will be described briefly below with reference to FIGS. 23A to 23M. At first, a base material is prepared (FIG. 23A). A counterbore 23 is formed on the base substrate 2 (FIG. 23B). The counterbore 23 is filled with copper by electroplating to form a sacrifice layer 24 (FIG. 23C). Then, a seed layer 25 is formed by sputtering (FIG. 23D), and a resist layer 26 is formed (FIG. 23E). Subsequently, the base material for the probe pins 1 is disposed by electroplating and a low-resistance metal layer 5 is disposed over a wiring layer of the base substrate 2 by electrolytic plating, electroless plating, or sputtering (FIGS. 23F, 23G, and 23H). The resist layer 26 and the sacrifice layer 24 are removed by wet-etching (FIGS. 23I and 23J), and then the base material of the probe pins 1 is cut (FIG. 23K). At this point, a unit of the probe pins 1 is completed. The entire process is completed after four units, which are each connected to a FPC board 7 (FIG. 23L), are attached to an inspection substrate 8 (FIG. 23M).

The step of forming the roughness pattern on the tips of the probe pins 1 should most preferably be carried out after the surface of the base material of the probe pins 1 is exposed and after the sacrifice layer 24 is disposed. In other words, it is best to carry out this step after the first and second metal forming steps and the resist removal step are carried out. As illustrated in FIGS. 24A to 24O, the step of transferring the roughness pattern 6 onto the tip of the probe pins 1 of the inspection probe, illustrated in FIGS. 16A and 16B, may preferably be carried out when the surface of the base material of the probe pins 1 has been exposed, similar to the steps illustrated in FIGS. 23A to 23M. Accordingly, it is best to carry out the step of transferring the roughness pattern 6 after the first and second metal-layer forming step and the resist removal step are carried out. It is also preferable to carry out the step of transferring the roughness pattern 6 after the rear surface of the backing material is thinned or after the base material of the probe pins 1 is removed from the bed 28. Wax 27 is applied to the bed 28.

According to the second method for forming the roughness pattern 6 on the tips of the probe pins 1 of the inspection probe according to the present invention, which is a probe card in this case, the roughness pattern 6 is formed after the probe card is completed. This second method is described with reference to FIGS. 21A and 21B. After the probe card is completed, a material having the roughness pattern 6 on its surface, as illustrated in FIGS. 22A to 22C, is feed to an absorption stage 18. Then, as illustrated in FIG. 21B, a predetermined overdrive (penetration) is applied. In this state, the absorption stage 18 is reciprocated horizontally, vertically, and diagonally to mechanically form the fine roughness pattern 6. For example, by fixing a wrapping sheet 20 (#2000), illustrated in FIGS. 22A to 22C, onto the absorption stage 18 and reciprocating the absorption stage 18 fifty times for a distance of 300 μm in the longitudinal direction of the probe pins 1 while applying an overdrive of 70 μm to a 20-μm-pitch probe, the roughness pattern 6 illustrated in FIG. 15 is formed. After forming the roughness pattern 6, at least one precious metal layer 4 having a thickness of 0.01 μm or more is formed by electroless plating, electrolytic plating, or sputtering since the precious metal layer 4 prevents the oxidation of the surface of the base material of the probe pins 1.

Method for Inspection

Figure 25A:
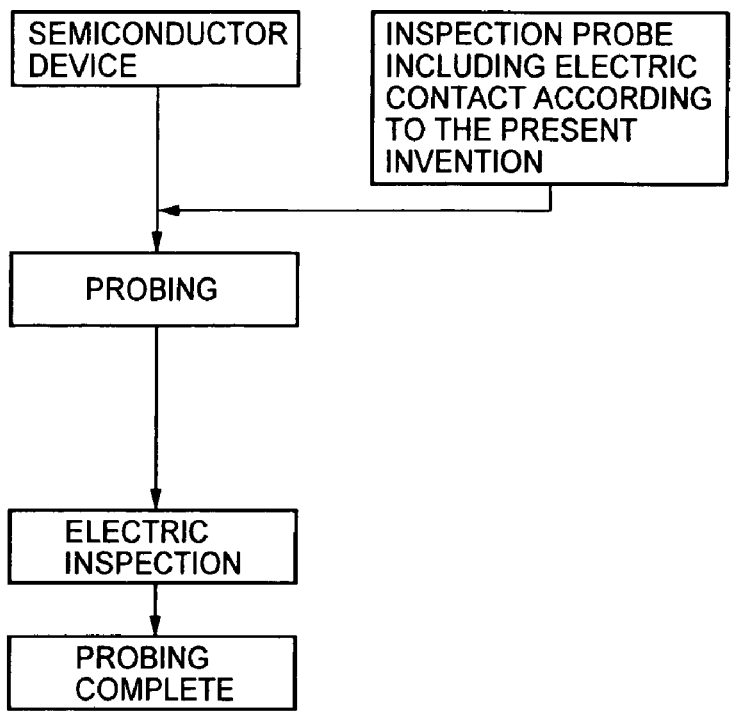
FIGS. 25A to 25D are flowcharts illustrating methods for inspection according to the present invention.
Figure 25B:
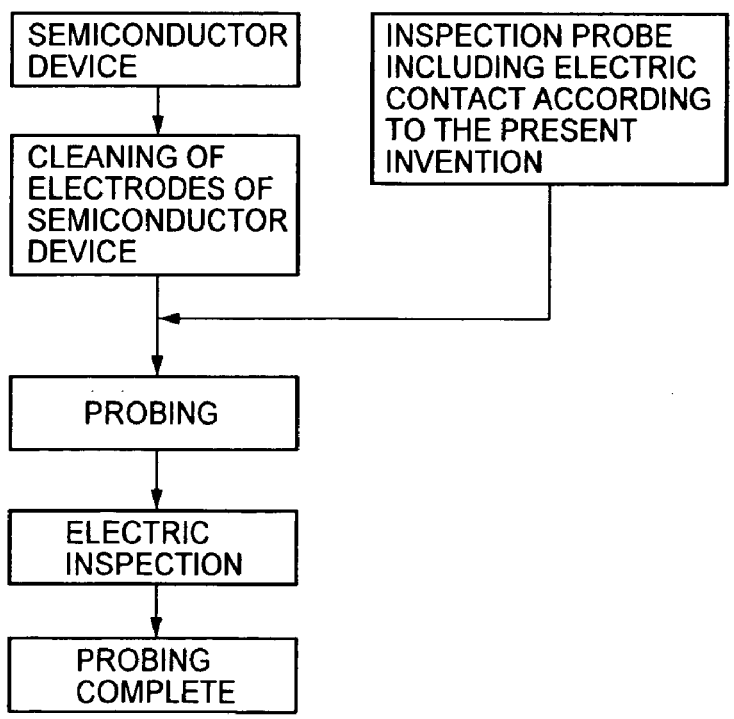

Next, a method for inspecting elements according to the present invention will be described with reference to FIGS. 25A to 26B. FIGS. 25A to 25D illustrate detailed flow charts of four examples of the method for inspecting elements according to the present invention. FIGS. 26A and 26B are cross-sectional views showing a method for applying vibrational energy to an inspection probe according to the second embodiment of the present invention.

The four examples of the method for inspecting elements will now be described with reference to FIGS. 25A to 25D. FIG. 25A is a flow chart describing a method in which only probe pins 1 of the inspection probe having electric contacts according to the present invention are used. According to the process shown in this flow chart, the inspection probe according to the present invention, which has been attached to an inspection device (prober) in advance. Then an electric inspection is performed by probing the elements which in this case are electrodes 11 of a semiconductor device 10. Finally, the inspection probe is removed from the electrodes 11 after the inspection is completed. FIG. 25B is a flow chart describing a method in which the electrodes 11 of the semiconductor device 10 is cleaned in advance and then the inspection probe according to the present invention is brought into contact with the electrodes 11 of the semiconductor device 10 for an electric inspection. For the cleaning the surface of the electrodes 11 of the semiconductor device 10, sulfuric acid and hydrogen peroxide may be used. For example, the electrodes 11 may be immersed in a 1:1:100 (volume ratio) mixture of 96% solution of sulfuric acid, a 30% to 35.5% solution of hydrogen peroxide, and purified water for five minutes at room temperature. Then the surfaces of the electrodes 11 are rinsed with purified water and are dried with dry air or nitrogen gas. The volume ratio of the mixture may be 1:1:100 to 1:1:1000. According to this cleaning method, by adding hydrogen peroxide, which is an oxidant, to sulfuric acid, a thin layer of the copper can be removed together with the oxidation film despite copper being a stable metal. The following formulae (1) to (4) are the chemical reaction formulae describing the reactions that occur during the cleaning process:

Hydrogen peroxide as an oxidant $H_2O_2 \rightarrow H_2O+(O)$ (1)

Oxidation power of copper $Cu+(O) \rightarrow CuO$ (2)

Neutralization $CuO+H_2SO_4 \rightarrow CuSO_4+H_2O$ (3)

$CuO+H_2SO_4+H_2O_2 \rightarrow CuSO_4+2H_2O$ (4)

Figure 25C:
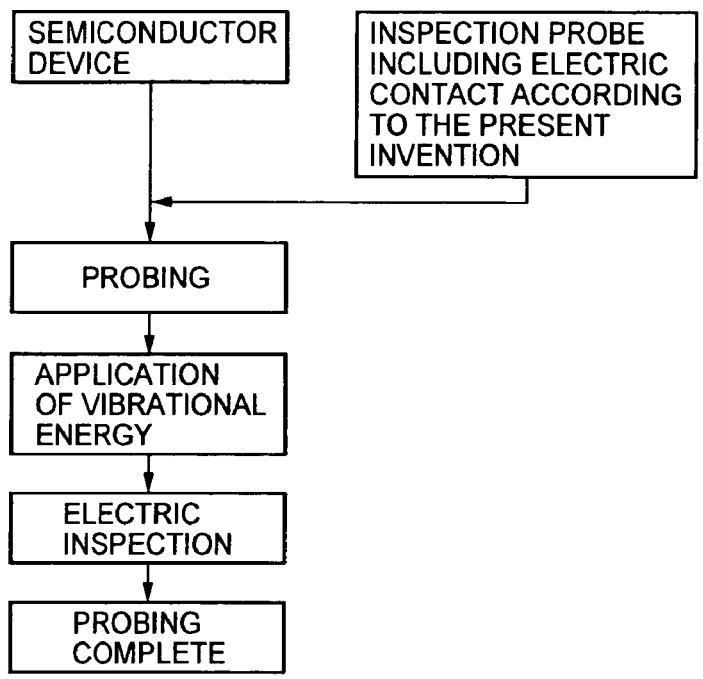
Figure 25D:
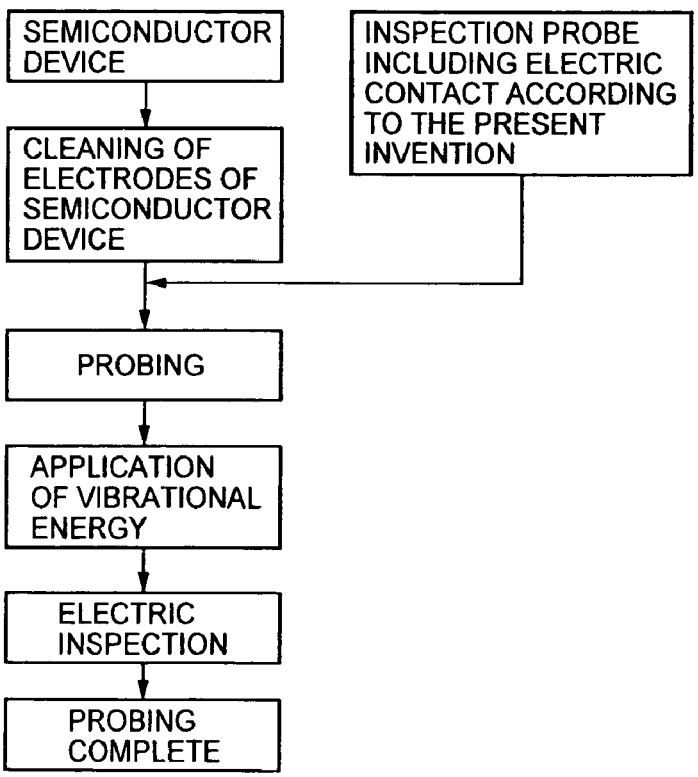
Figure 26A:
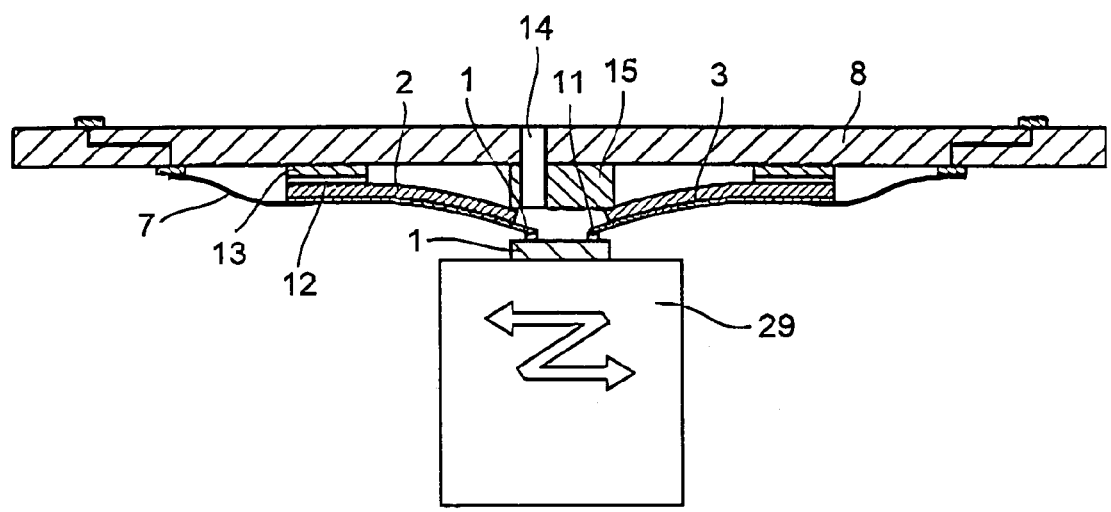
Figure 26B:
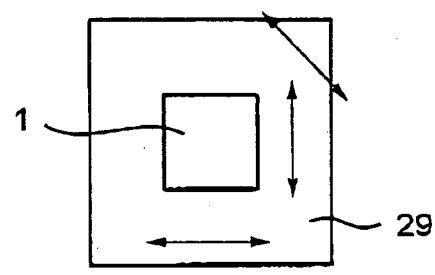

FIG. 25C is a flow chart describing a method in which vibrational energy is applied to the inspection probe according to the present invention. A semiconductor inspection device (prober) having a vibrational-energy generator including the inspection probe according to the present invention, as illustrated in FIGS. 26A and 26B, is used for probing the electrodes 11 of the semiconductor device 10. Then, vibration in the horizontal, vertical, or diagonal direction is transferred to the semiconductor device to vibrate the electrodes 11 of the semiconductor device 10. In this way, the roughness pattern 6 according to the present invention on the tips of probe pins 1 breaks the oxidation films. When considering the arrangement of the probe pins 1 and the shape of the electrodes 11, the vibration most preferably should be in the diagonal direction. FIG. 25D is a flow chart describing a method in which the electrodes 11 of the semiconductor device 10 are cleaned in advance, then the inspection probe according to the present invention is brought into contact with the electrodes 11 of the semiconductor device 10, and vibrational energy is applied.

If the electrode pitch of the electrodes 11 of the semiconductor device 10 is in the order of 20 μm, excellent contact can be achieved by carrying out the process illustrated in FIG. 25B. However, even for a fine electrode pitch of less than 20 μm, the contact is satisfactory.

Figure 29:
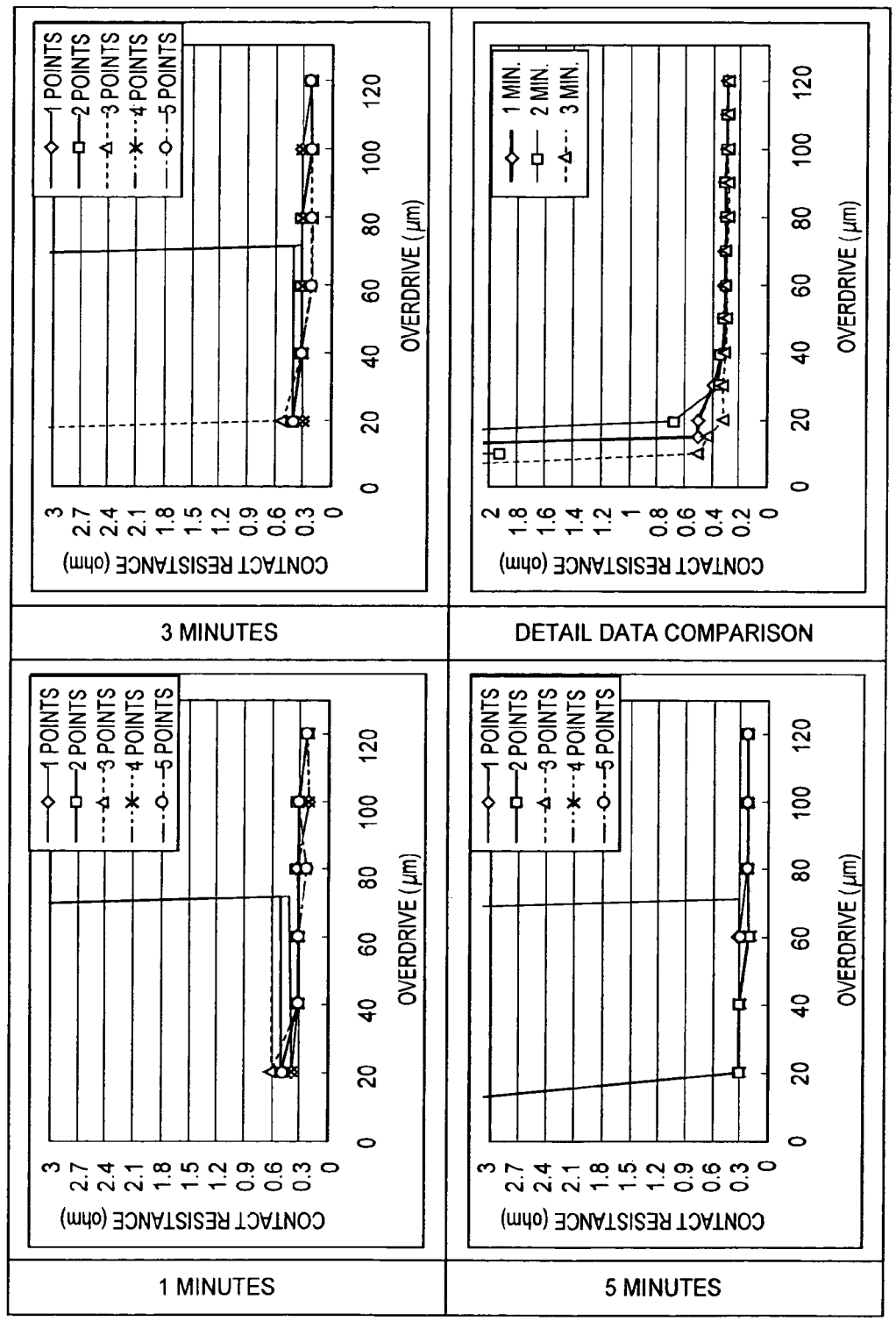
FIG. 29 shows graphs indicating the effect of the processing time of sulfuric acid and hydrogen peroxide.

FIG. 29 shows graphs indicating the effect of the time of the processing with sulfuric acid and hydrogen peroxide. Through the results of an experiment, it has been confirmed that the most suitable amount of time for processing with sulfuric acid and hydrogen peroxide is 1 to 10 minutes and the most suitable amount of time for rinsing with purified water is 5 seconds to 3 minutes (realize the overdrive: 20 μm, 0.3 ohm).

As is apparent from the description above, the present invention has the following advantages: 1) the inspection probe according to the present invention provides excellent contact characteristics between the probe pin and the electrode of the semiconductor device; 2) the durability of the probe pin is improved; 3) the structure of the electrical contact, the method for preparing the electrical contact and the method for inspecting an element are simplified and are easily operable; and 4) the cost for producing the inspection probe according to the present invention is reduced and the method for preparing the inspection probe is simplified.

What is claimed is:

1. An inspection probe comprising:
   resilient probe pins having electric contacts disposed in positions corresponding to electrodes of an external terminal of a semiconductor device at an angle between zero to ninety degrees to the surface of the electrodes on the semiconductor device, the probe pins being disposed as independent structures;
   a base substrate including pitch-expansion wiring layers of the probe pins; and
   a backup substrate for supporting the probe pins, the base substrate, and a flexible substrate, the flexible substrate being interposed between the base substrate and an inspection substrate to be attached to a semiconductor inspection device together with the pitch-expansion wiring layers;
   wherein at least one precious metal layer is disposed in a predetermined area at the tip of the probe pins on the side having the electric contact for contacting the electrodes of the semiconductor device to be inspected,
   wherein at least one metal layer is disposed on the probe pins and the pitch-expansion wiring layers,
   wherein the precious metal layer and the metal layer are composed of the same material or composed of different materials,
   wherein a roughness pattern comprising fine marks is provided on the surfaces of the probe pins on the side having the electric contacts for contacting the electrodes of the semiconductor device to be inspected, and
   wherein the probe pins comprise a resilient base material.

2. The inspection probe according to claim 1,
   wherein the width of the roughness pattern provided on the probe pins is the same as or smaller than the width of the probe pins, and
   wherein the longitudinal length of the roughness pattern provided on the probe pins is the same or longer than the sum of the distance the probe pins are moved after the electric contacts of the probe pins contact the electrodes of the semiconductor device and the distance determined by taking into consideration the positional tolerance in the longitudinal direction of the probe pins and the positional tolerance of the electrodes.

3. The inspection probe according to claim 2, wherein the precious metal layer is only disposed over the roughness pattern of the probe pins.

4. The inspection probe according to claim 2 or 3, wherein the fine marks of the roughness pattern are provided in the same direction of the movement of the probe pin, in the direction orthogonal to the movement of the probe pin, in a grid, in a diagonal grid, or in random directions.

5. The inspection probe according to claim 2, wherein the fine marks of the roughness pattern have a depth of 1 μm or less.

6. The inspection probe according to claim 1, further comprising:
   a support substrate attached to the periphery of the base substrate;
   wherein the probe pins and the base substrate including the pitch-expansion wiring layers are thinned, and
   wherein the thinned base substrate including the support substrate is attached to the inspection substrate so that the probe pins form a 0° to 45° angle with the electrodes of the semiconductor device.

7. The inspection probe according to claim 1, further comprising:
bumps for connecting a through-substrate electrode and the inspection substrate, the bumps being disposed on the periphery of the pitch-expansion wiring layers;
wherein the probe pins and the base substrate including the pitch-expansion wiring layers are thinned,
wherein the base substrate including the pitch-expansion wiring layers is provided to change the pitch of the probe pins, and
wherein the flexible substrate is not inevitable.

8. A method for forming a roughness pattern on the probe pins of the inspection probe according to claim 1, the method comprising one of the processes of mechanically scraping off portions of the tip of the probe pins with a wrapping sheet having a roughness pattern, pressing the tip of the probe pins against a fired ceramic substrate having a suitable porosity to transfer the roughness pattern onto the probe pins, and pressing the tip of the probe pin against a silicon substrate having the roughness pattern preformed by etching to transfer the roughness pattern onto the probe pins.

9. The method according to claim 8,
wherein the fine marks of the roughness pattern are formed on the tip of the probe pins after the base material of the probe pins is disposed on the base substrate or after the base substrate is thinned to a predetermined thickness.

10. The method according to claim 8,
wherein the roughness pattern is formed on the tips of the probe pins after the assembly of the inspection probe is completed by bringing the probe pins into contact with one of the wrapping sheet, the ceramic substrate, and the silicon substrate and scrubbing the probe pins against said one of the wrapping sheet, the ceramic substrate, and the silicon substrate by fixing the probe pin and reciprocating said one of the wrapping sheet, the ceramic substrate, and the silicon substrate in the horizontal, vertical, or diagonal direction or by reciprocating the probe pin in the horizontal, vertical, or diagonal direction and fixing said one of the wrapping sheet, the ceramic substrate, and the silicon substrate.

* * * * *